(12) United States Patent
Park et al.

(10) Patent No.: US 12,243,474 B2
(45) Date of Patent: Mar. 4, 2025

(54) EMISSIVE DISPLAY DEVICE INCLUDING LIGHT EMITTING DIODE, TRANSISTOR, AND CAPACITOR

(71) Applicant: Samsung Display Co., LTD., Yongin-si (KR)

(72) Inventors: Jun Hyun Park, Yongin-si (KR); Jang Mi Kang, Yongin-si (KR); Min Jae Jeong, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/480,505

(22) Filed: Oct. 4, 2023

(65) Prior Publication Data

US 2024/0161685 A1 May 16, 2024

(30) Foreign Application Priority Data

Nov. 16, 2022 (KR) .......................... 10-2022-0153659

(51) Int. Cl.
*G09G 3/32* (2016.01)
*H10K 59/131* (2023.01)
(Continued)

(52) U.S. Cl.
CPC ............. *G09G 3/32* (2013.01); *H10K 59/131* (2023.02); *G09G 3/30* (2013.01); *G09G 3/3233* (2013.01);
(Continued)

(58) Field of Classification Search
CPC ............. G09G 3/32; G09G 2300/0426; G09G 2320/0209; G09G 2320/0233;
(Continued)

(56) References Cited

U.S. PATENT DOCUMENTS

2005/0243039 A1\* 11/2005 Kwak ................. G09G 3/3233
345/76
2014/0347401 A1\* 11/2014 Hwang ................ G09G 3/3233
345/82

(Continued)

FOREIGN PATENT DOCUMENTS

KR 10-2016-0069055 6/2016
KR 10-2021-0057629 5/2021
(Continued)

*Primary Examiner* — Adam J Snyder
(74) *Attorney, Agent, or Firm* — KILE PARK REED & HOUTTEMAN PLLC

(57) ABSTRACT

An emissive display device includes a driving transistor that includes a driving gate electrode, a first electrode, and a second electrode; a storage capacitor that includes a first electrode connected to the driving gate electrode and a second electrode; a hold capacitor that includes a first electrode connected to the second electrode of the storage capacitor and a second electrode to which a driving voltage is applied; and a light emitting diode that includes an anode, it further includes a connector that connects the first electrode of the hold capacitor and the second electrode of the hold capacitor, the first electrode of the hold capacitor is in a first gate conductive layer, and the second electrode of the storage capacitor is in a second gate conductive layer, the connector is in a first data conductive layer on the first gate conductive layer and the second gate conductive layer.

20 Claims, 27 Drawing Sheets

(51) Int. Cl.
   *G09G 3/30*      (2006.01)
   *G09G 3/3233*    (2016.01)
   *H10K 50/805*    (2023.01)
   *H10K 59/121*    (2023.01)
   *H10K 59/123*    (2023.01)
   *H10K 59/88*     (2023.01)
   *H10K 71/00*     (2023.01)

(52) U.S. Cl.
   CPC ............. *G09G 2300/0426* (2013.01); *G09G 2300/0819* (2013.01); *G09G 2300/0852* (2013.01); *G09G 2310/08* (2013.01); *G09G 2320/0209* (2013.01); *G09G 2320/0233* (2013.01); *G09G 2330/021* (2013.01); *G09G 2330/08* (2013.01); *G09G 2330/10* (2013.01); *H10K 50/805* (2023.02); *H10K 59/121* (2023.02); *H10K 59/1213* (2023.02); *H10K 59/1216* (2023.02); *H10K 59/123* (2023.02); *H10K 59/88* (2023.02); *H10K 71/861* (2023.02)

(58) Field of Classification Search
   CPC ......... G09G 2330/024; G09G 2330/08; G09G 2300/0819; G09G 2310/08; G09G 3/30; G09G 3/3233; G09G 2330/10; H10K 59/131; H10K 59/121; H10K 59/88; H10K 59/1213; H10K 59/1216; H10K 59/123; H10K 50/805; H10K 71/861
   See application file for complete search history.

(56) References Cited

U.S. PATENT DOCUMENTS

| | | | | |
|---|---|---|---|---|
| 2015/0348464 | A1* | 12/2015 | In | G09G 3/3233 345/82 |
| 2016/0035283 | A1* | 2/2016 | Park | G09G 3/3258 345/78 |
| 2021/0065628 | A1* | 3/2021 | Kim | G09G 3/3233 |
| 2021/0327361 | A1* | 10/2021 | Park | G09G 3/3266 |

FOREIGN PATENT DOCUMENTS

| | | |
|---|---|---|
| KR | 10-2021-0098412 | 8/2021 |
| KR | 10-2021-0115118 | 9/2021 |
| KR | 10-2021-0153356 | 12/2021 |

* cited by examiner

EMISSIVE DISPLAY DEVICE INCLUDING LIGHT EMITTING DIODE, TRANSISTOR, AND CAPACITOR

CROSS-REFERENCE TO RELATED APPLICATION(S)

This application claims priority to and benefits of Korean Patent Application No. 10-2022-0153659 under 35 U.S.C. § 119, filed in the Korean Intellectual Property Office on Nov. 16, 2022, the entire contents of which are incorporated herein by reference.

BACKGROUND

1. Technical Field

The disclosure relates to an emissive display device.

2. Description of the Related Art

A display device serves to display a screen, and includes a liquid crystal display, an organic light emitting diode display, and the like. Such a display device is used in various electronic devices such as mobile phones, navigation units, digital cameras, electronic books, portable game machines, and various terminals.

An emissive display device such as an organic light emitting diode display may have a structure in which the display device can be bent or folded using a flexible substrate.

The above information disclosed in this background section is only for enhancement of understanding of the background of the described technology, and therefore, it may contain information that does not form the prior art that may already be known to a person of ordinary skill in the art.

SUMMARY

Embodiments have been made in an effort to provide an emissive display device capable of high-frequency driving, and to provide an emissive display device capable of repairing defective pixels in case that they are included.

The technical objectives to be achieved by the disclosure are not limited to those described herein, and other technical objectives that are not mentioned herein would be clearly understood by a person skilled in the art from the description of the disclosure.

An embodiment provides an emissive display device that may include a driving transistor including a driving gate electrode, a first electrode, and a second electrode; a storage capacitor including a first electrode electrically connected to the driving gate electrode and a second electrode; a hold capacitor including a first electrode electrically connected to the second electrode of the storage capacitor and a second electrode to which a driving voltage is applied; and a light emitting diode including an anode, including a connector configured to electrically connect the first electrode of the hold capacitor and the second electrode of the storage capacitor, wherein the first electrode of the hold capacitor is disposed in a first gate conductive layer, and the second electrode of the storage capacitor is disposed in a second gate conductive layer, and the connector is disposed in a first data conductive layer disposed on the first gate conductive layer and the second gate conductive layer.

The emissive display device may further include a semiconductor layer disposed on a substrate; the first gate conductive layer disposed on the semiconductor layer; the second gate conductive layer disposed on the first gate conductive layer; the first data conductive layer disposed on the second gate conductive layer; and a second data conductive layer disposed on the first data conductive layer, and the driving gate electrode may be disposed in the first gate conductive layer, the second electrode of the hold capacitor may be disposed in the second gate conductive layer.

The emissive display device may further include a second transistor including a first electrode receiving a data voltage and a second electrode electrically connected to the second electrode of the storage capacitor; and a third transistor configured to electrically connect the driving gate electrode of the driving transistor and a second electrode of the driving transistor.

The emissive display device may further include, a fifth transistor a fourth transistor configured to initialize a G node to a first initialization voltage; and a fifth transistor configured to change a D node to a reference voltage, wherein a node to which the first electrode of the storage capacitor is electrically connected is the G node, and a node to which the second electrode of the storage capacitor is electrically connected is the D node.

The emissive display device may further include a sixth transistor configured to electrically connect the anode of the light emitting diode and the second electrode of the driving transistor; and a seventh transistor configured to initialize the anode to a second initialization voltage.

The emissive display device may further include an eighth transistor configured to transfer a bias voltage to the first electrode of the driving transistor; and a ninth transistor configured to transfer the driving voltage to the first electrode of the driving transistor.

The second initialization voltage and the first initialization voltage may have a same voltage value or different voltage values.

An embodiment provides an emissive display device that may include a display pixel disposed in a display area to include a pixel circuit part and a light emitting diode; a repair pixel disposed outside the display area and not including a light emitting diode; and a repair line that extends from the display pixel to the repair pixel, wherein the pixel circuit part of the display pixels includes a first pixel circuit part that includes a driving transistor to allow the driving transistor to generate an output current; and a second pixel circuit part that includes a seventh transistor for initializing an anode of the light emitting diode, and the repair pixel includes a first repair pixel part that has a same configuration as that of the first pixel part; and a second repair pixel part that includes a tenth transistor and an additional capacitor, wherein the tenth transistor includes a first electrode electrically connected to the repair line and a second electrode electrically connected to a first electrode of the additional capacitor, and a driving voltage is applied to a second electrode of the additional capacitor.

The second repair pixel part may further include an eleventh transistor, a first electrode of the eleventh transistor may receive an initialization voltage, and a second electrode of the eleventh transistor may be electrically connected to the second electrode of the tenth transistor and the first electrode of the additional capacitor.

An area occupied by the repair pixel may be larger than an area of the display pixel.

The repair pixel may have an area that is larger than the display pixel by an area occupied by the additional capacitor.

The first pixel circuit part and the first repair pixel part may each include a storage capacitor that includes a first electrode electrically connected to a driving gate electrode of the driving translator and a second electrode; a second transistor electrically connected to the second electrode of the storage capacitor; a hold capacitor that includes a first electrode electrically connected to the second electrode of the storage capacitor and a second electrode to which the driving voltage is applied; and a third transistor configured to connect the driving gate electrode of the driving transistor and a second electrode of the driving transistor.

The first pixel circuit part and the first repair pixel part may each further include a fourth transistor configured to initialize the G node; a fifth transistor configured to transfer a reference voltage to the D node; and a sixth transistor includes a first electrode electrically connected to the second electrode of the driving transistor, and a second electrode of the sixth transistor may be electrically connected to the anode of the light emitting diode in the display pixel, while a second electrode of the sixth transistor may be electrically connected to the first electrode of the tenth transistor and the repair line in the repair pixel in case that a node to which the first electrode of the storage capacitor is electrically connected is the G node, and a node to which the second electrode of the storage capacitor is electrically connected is the D node.

The first pixel circuit part and the first repair pixel part may each further include an eighth transistor configured to transfer a bias voltage to a first electrode of the driving transistor; and a ninth transistor configured to transfer the driving voltage to the first electrode of the driving transistor.

An initialization voltage transferred to the first electrode of the eleventh transistor may have a voltage that is substantially equal to or different from a voltage for initializing the G node through the fourth transistor.

A voltage for initializing the anode by the seventh transistor may be same as the voltage for initializing the G node through the fourth transistor or the initialization voltage transferred to the first electrode of the eleventh transistor.

At least one of transistors included in the first pixel circuit part and at least corresponding one of transistors included in the first repair pixel part may have a same transistor size.

Capacitance magnitudes of the storage capacitors included in the first pixel circuit part and the first repair pixel part may be the same as or different from each other, and capacitance magnitudes of the hold capacitors included in the first pixel circuit part and the first repair pixel part may be the same as or different from each other.

An expanding portion may be included in an area where the display pixel and the repair pixel are disposed, in the repair line, and the expanding portion may be short-circuited in case that a defective display pixel is repaired.

An another expanding portion may be included at an end of the repair line, and the another expanding portion disposed at the end of the repair line may also be short-circuited in case that the defective display pixel is repaired.

According to embodiments, crosstalk may be eliminated or power consumption may be reduced during high-frequency driving by forming two capacitors in one display pixel, enabling high-speed driving. According to embodiments, the repair pixel may be included in the non-display area, and the structure of the repair pixel may be formed to be similar to that of the display pixel to enable repair.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
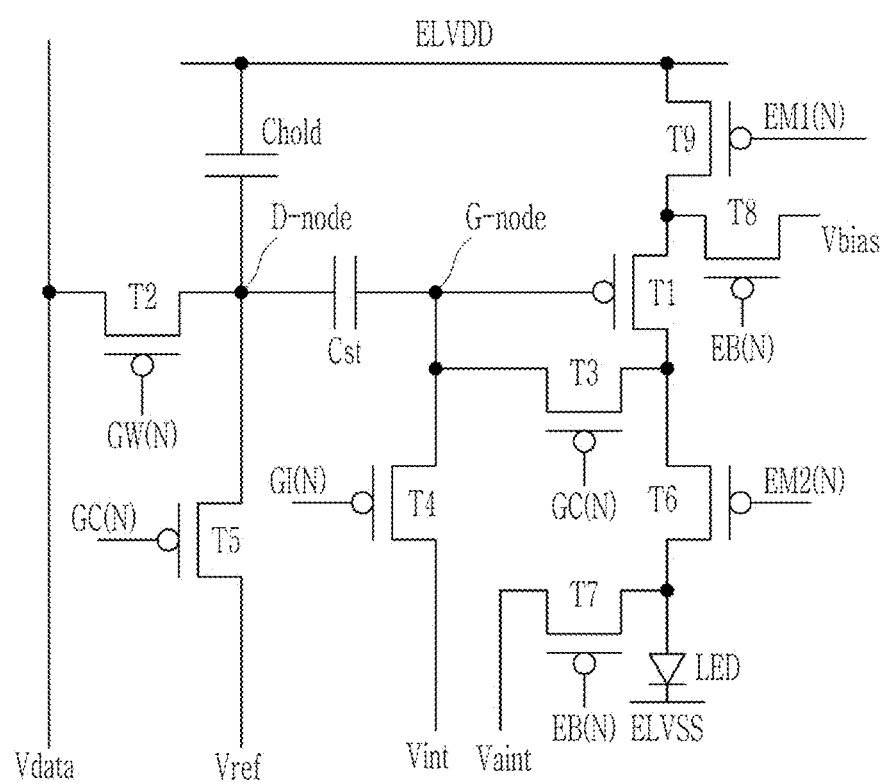
FIG. 1 illustrates a schematic diagram of an equivalent circuit of a display pixel included in an emissive display device according to an embodiment.

The disclosure will be described more fully hereinafter with reference to the accompanying drawings, in which embodiments are shown. As those skilled in the art would realize, the described embodiments may be modified in various different ways, all without departing from the spirit or scope of the disclosure.

To clearly describe the disclosure, parts that are irrelevant to the description may be omitted, and like numerals refer to like or similar constituent elements throughout the specification.

Further, since sizes and thicknesses of constituent members shown in the accompanying drawings are arbitrarily given for better understanding and ease of description, the disclosure is not limited to the illustrated sizes and thicknesses. In the drawings, the thicknesses of layers, films, panels, regions, etc., are exaggerated for clarity. In the drawings, for better understanding and ease of description, the thicknesses of some layers and areas are exaggerated.

It will be understood that when an element such as a layer, film, region, plate, constitute elements, etc. is referred to as being "on" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

As used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

The terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

Further, throughout the specification, the phrase "in a plan view" means when an object portion is viewed from above, and the phrase "in a cross-sectional view" means when a cross-section taken by vertically cutting an object portion is viewed from the side.

In addition, in the specification, "connected" means that two or more components are not only directly connected, but two or more components may be connected indirectly through other components, physically connected as well as being electrically connected, or it may be referred to by different names depending on the location or function, but may include connecting each of parts that are substantially integral to each other.

In addition, throughout the specification, when it is said that a portion of a wire, layer, film, region, plate, component, etc., "extends in a first direction or a second direction," this does not indicate only a straight shape extending straight in the corresponding direction, and indicates a structure that generally extends along the first direction or the second direction, and it includes a structure that is bent at a portion, has a zigzag structure, or extends while including a curved structure.

It will be understood that, although the terms first, second, etc., may be used herein to describe various elements, these elements should not be limited by these terms. These terms are only used to distinguish one element from another element. For example, a first element may be referred to as a second element, and similarly, a second element may be referred to as a first element without departing from the scope of the disclosure.

The term "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value."

For the purposes of this disclosure, the phrase "at least one of A and B" may be construed as A only, B only, or any combination of A and B. Also, "at least one of X, Y, and Z" and "at least one selected from the group consisting of X, Y, and Z" may be construed as X only, Y only, Z only, or any combination of two or more of X, Y, and Z. The term "overlap" or "overlapped" means that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art. The expression "not overlap" may include meaning such as "apart from" or "set aside from" or "offset from" and any other suitable equivalents as would be appreciated and understood by those of ordinary skill in the art. The terms "face" and "facing" may mean that a first object may directly or indirectly oppose a second object. In a case in which a third object intervenes between a first and second object, the first and second objects may be understood as being indirectly opposed to one another, although still facing each other.

Unless otherwise defined or implied herein, all terms (including technical terms and scientific terms) used in the specification have the same meaning as commonly understood by one skilled in the art to which the disclosure belongs. Terms such as terms defined in the dictionaries commonly used should be interpreted as having a meaning consistent with the meaning in the context of the related technology, and should not be interpreted in ideal or overly formal meanings unless explicitly defined herein.

An electronic device (for example, a mobile phone, TV, monitor, notebook computer, etc.) including a display device, a display panel, etc. described in the specification, or an electronic device including a display device and a display panel manufactured by the manufacturing method described in the specification, are not excluded from the scope of the specification.

Hereinafter, a circuit structure of one display pixel positioned in a display area of an emissive display device according to an embodiment will be described with reference to FIG. 1.

FIG. 1 illustrates a schematic diagram of an equivalent circuit of one display pixel included in an emissive display device according to an embodiment.

The pixel of FIG. 1 will be described by taking as an example a pixel included in an $N^{th}$ pixel row in case that display pixels are formed in the display area of the emissive display device.

Referring to FIG. 1, one pixel includes a light emitting diode LED and a pixel circuit unit driving the same, and pixel circuit units are arranged or disposed in a matrix form. The pixel circuit unit includes all elements other than the light emitting diode LED in FIG. 1, and the pixel circuit unit of the pixel according to an embodiment of FIG. 1 includes a driving transistor T1 (hereinafter also referred to as a first transistor), a second transistor T2, a third transistor T3, a fourth transistor T4, a fifth transistor T5, a sixth transistor T6, a seventh transistor T7, an eighth transistor T8, a ninth transistor T9, a storage capacitor Cst (hereinafter referred to as a first capacitor), and a hold capacitor Chold (hereinafter also referred to as a second capacitor). The pixel circuit unit may be connected to a first scan line to which a first scan signal GW(N) is applied, a second scan line to which a second scan signal GC(N) is applied, a third scan line to which a third scan signal GI(N) is applied, a fourth scan line to which a fourth scan signal EB(N) is applied, a first emission signal line to which a first emission control signal EM1(N) is applied, a second emission signal line to which a second emission control signal EM2(N) is applied, and a data line to which a data voltage Vdata is applied. The pixel may receive a driving voltage ELVDD (hereinafter also referred to as a first driving voltage), a driving low voltage ELVSS (hereinafter also referred to as a second driving voltage), a first initialization voltage Vint, a second initialization voltage Vaint, a reference voltage and a bias Vbias.

A structure of a pixel focusing on each element (transistor, capacitor, and light emitting diode) included in the pixel will be described as follows.

The driving transistor T1 includes a gate electrode connected to a first electrode of the storage capacitor Cst (hereinafter also referred to as a driving gate electrode), a first electrode (input-side electrode) that receives the driving voltage ELVDD, and a second electrode (output-side electrode) that outputs a current depending on a voltage of the gate electrode. A gate electrode of the driving transistor T1 is connected to a second electrode (output-side electrode) of the third transistor T3, a second electrode (output-side electrode) of the fourth transistor T4, and the first electrode of the storage capacitor Cst. The first electrode of driving transistor T1 is connected to a second electrode (output-side electrode) of the eighth transistor T8 and a second electrode (output-side electrode) of the ninth transistor T9. The second electrode of the driving transistor T1 is connected to a first electrode (input-side electrode) of the third transistor T3 and a first electrode (input-side electrode) of the sixth transistor T6. The output current of the driving transistor T1 is transmitted to the light emitting diode LED through the sixth transistor T6, to enable the light emitting diode LED to emit light. Luminance of the light emitted from the light emitting diode LED is determined depending on a magnitude of an output current of the driving transistor T1. Hereinafter, a gate electrode of the driving transistor T1 is also referred to as a G-node, and the G-node may also include the second electrode (output-side electrode) of the third transistor T3, the second electrode (output-side electrode) of the fourth transistor T4, and the first electrode of the storage capacitor Cst.

The second transistor T2 (hereafter also referred to as a switching transistor) may include a gate electrode connected to a first scan line to which a first scan signal GW(N) is applied, a first electrode (input-side electrode) connected to the data line to which the data voltage Vdata is applied, and a second electrode (output-side electrode) connected to the second electrode of the storage capacitor Cst. The second transistor T2 allows the data voltage Vdata to enter the display pixel and to be stored in the storage capacitor Cst according to the first scan signal GW(N). A second electrode of the second transistor T2 is connected to a second electrode (output-side electrode) of the fifth transistor T5 and a first electrode of the hold capacitor Chold. Hereinafter, a second electrode of the second transistor T2 is also referred to as a D-node, and the D-node may also include the second electrode of the storage capacitor Cst, the second electrode (output-side electrode) of the fifth transistor T5, and the first electrode of the hold capacitor Chold.

A stacked structure according to an embodiment including the D-node and the G-node will be described in detail through FIG. 3 to FIG. 11.

The holding capacitor Cst (hereinafter also referred to as a voltage transfer capacitor or first capacitor) includes a first electrode connected to the gate electrode of the driving transistor T1, the second electrode of the second transistor T2, the second electrode of the fifth transistor T5, and a second electrode connected to the first electrode of the hold capacitor Chold. The storage capacitor Cst serves to receive the data voltage Vdata outputted from the second transistor T2, to transfer it as a voltage of the gate electrode of the driving transistor T1, and to maintain it. In the display pixel of an embodiment, the data voltage Vdata is not directly transferred to the gate electrode of the driving transistor T1, but is transferred through the storage capacitor Cst. This is a method of indirectly transferring the data voltage Vdata to the gate electrode of the driving transistor T1 by using the fact that the voltage of the first electrode, which is a second-side electrode, also rises, in case that a voltage of the second electrode of the storage capacitor Cst suddenly rises. According to such a method, even in case that leakage occurs in the second transistor T2, the voltage of the gate electrode of the driving transistor T1 does not leak directly. In an embodiment, the data voltage Vdata is transferred directly to the gate electrode of the driving transistor T1 through the storage capacitor Cst without passing through another electrode of the driving transistor T1, and thus even in case that there is a difference in the driving voltage ELVDD depending on a position of the pixel, a voltage stored in the storage capacitor Cst is determined without affecting the difference in the driving voltage ELVDD.

The hold capacitor Chold (hereinafter also referred to as a second capacitor) includes a first electrode connected to the second electrode of the storage capacitor Cst and a second electrode receiving the driving voltage ELVDD. The first electrode of the hold capacitor Chold is additionally connected to the second electrode of the second transistor T2 and the second electrode of the fifth transistor T5. According to the hold capacitor Chold, the voltage of the D-node is held without being changed even in case that a surrounding signal changes, so that it can have a constant voltage.

The second transistor T3 (hereafter also referred to as a compensation transistor) may include a gate electrode connected to a second scan line to which a second scan signal GC(N) is applied, a first electrode (input-side electrode) connected to the second electrode of the driving transistor T1, and a second electrode (output-side electrode) connected to the G-node. Accordingly, the second electrode of the third transistor T3 is connected to the first electrode of the storage capacitor Cst, the driving gate electrode of the driving transistor T1, and the second electrode of the fourth transistor T4. The third transistor T3 may enable a threshold voltage of the driving transistor T1 to be transferred to the first electrode of the storage capacitor Cst and to be compensated by forming a compensation path for compensating the threshold voltage of the driving transistor T1. As a result, even in case that the threshold voltage of the driving transistor T1 included in each pixel is different, the driving transistor T1 may output a constant output current depending on the applied data voltage Vdata.

The fourth transistor T4 (hereinafter also referred to as a G-node initialization transistor) includes a gate electrode connected to a third scan line to which a third scan signal GI(N) is applied, a first electrode receiving a first initialization voltage Vint, and a second electrode connected to the G-node. The fourth transistor T4 serves to initialize the first electrode of the storage capacitor Cst and the gate electrode of the driving transistor T1 to the first initialization voltage Vint.

The fifth transistor T5 (hereinafter also referred to as a D-node initialization transistor) includes a gate electrode connected to a second scan line to which a second scan signal GC(N) is applied, a first electrode receiving a reference voltage Vref, and a second electrode connected to the D-node. The fifth transistor serves to initialize the second electrode of the storage capacitor Cst and the first electrode of the hold capacitor Chold by changing each of them into the reference voltage Vref.

The sixth transistor T6 (hereinafter also referred to as a current transfer transistor) includes a gate electrode connected to a second emission signal line to which a second emission control signal EM2(N) is applied, a first electrode (input-side electrode) connected to the second electrode of the driving transistor T1, and a second electrode (output-side electrode) connected to an anode of the light emitting diode LED. Herein, a first electrode of the sixth transistor T6 is also connected to the first electrode of the third transistor T3, and a second electrode of the sixth transistor T6 is also connected to a second electrode of the seventh transistor T7. The sixth transistor T6 serves to transmit an output current of the driving transistor T1 to the light emitting diode LED or to or block it based on the second emission control signal EM2(N).

The seventh transistor T7 (hereinafter also referred to as an anode initializing transistor) includes a gate electrode connected to a fourth scan line to which a fourth scan signal EB(N) is applied, a second electrode connected to the first electrode to which a second initialization voltage Vaint is applied, and an anode electrode of the light emitting diode LED. A second electrode of the seventh transistor T7 is also connected to a second electrode of the sixth transistor T6. The seventh transistor T7 has the second initialization voltage Vaint to initialize the anode of the light emitting diode LED. According to an embodiment, the seventh transistor T7 may receive the first initialization voltage Vint and transfer it to the anode electrode, and this embodiment will be described through FIG. 22 and the like within the spirit and the scope of the disclosure.

The eighth transistor (T8; hereinafter also referred to as a bias transistor) includes a gate electrode connected to a fourth scan line to which a fourth scan signal EB(N) is applied, a first electrode to which a bias voltage Vbias is applied, and a second electrode connected to the first electrode of the driving transistor T1. A second electrode of the eighth transistor T8 is also connected to a second electrode of the ninth transistor T9. The eighth transistor T8 may maintain a bias of the first electrode of the driving transistor T1 to be constant as a bias voltage Vbias, and even in case that driving high or low frequencies, may allow the driving transistor T1 to output a constant output current without changing the bias of the driving transistor T1. As a result, the driving transistor T1 may constantly generate an output current even during a period in which the data voltage Vdata is not transferred into the display pixel.

The ninth transistor T9 (hereinafter also referred to as a driving voltage transfer transistor) includes a gate electrode connected to a first light emitting signal line to which a first light emitting control signal EM1(N) is applied, a first electrode (input-side electrode) to which the driving voltage ELVDD is applied, and a second electrode (output-side electrode) connected to the first electrode of the driving transistor T1. A second electrode of the ninth transistor T9 is also connected to a second electrode of the eighth transistor T8. The ninth transistor T9 serves to transfer the driving voltage ELVDD to the driving transistor T1 based on the first emission control signal EM1(N).

All transistors in FIG. 1 may be formed by using a polycrystalline semiconductor, may be doped with a same type of doping particles, and may be turned on in case that a low voltage is applied and turned off in case that a high voltage is applied. As a result, a gate-on voltage is a low-level voltage and a gate-off voltage is a high-level voltage. Such a characteristic of the transistor is the basis for analyzing the waveform diagram of FIG. 2.

The light emitting diode LED includes an anode connected to the second electrode of the sixth transistor T6 and a cathode connected to the driving low voltage ELVSS. The light emitting diode LED may emit light with a luminance corresponding to a current supplied from the driving transistor T1. The light emitting diode LED may include an emission layer including at least one of an organic emission material and an inorganic emission material . Holes and electrons are injected from the anode and the cathode into the emission layer, and excitons formed by combining the injected holes and electrons are emitted in case that they fall from an excited state to a ground state. The light emitting diode LED may emit light of one of primary colors or white light. Examples of the primary colors may include three primary colors of red, green, and blue. Other examples of the primary colors include yellow, cyan, and magenta. According to an embodiment, a color display characteristic may be improved by further including an additional color filter or a color conversion layer.

In a circuit structure of the display pixel illustrated in FIG. 1, a portion except for the light emitting diode LED may also be called a pixel circuit unit, and the pixel circuit unit may be divided into a first pixel circuit unit that allows the driving transistor T1 to generate an output current and a second pixel circuit unit that initializes an anode of the light emitting diode LED. In FIG. 1, the second pixel circuit unit may include the seventh transistor T7, and the first pixel circuit unit may include all components other than the light emitting diode LED and the seventh transistor T7 in FIG. 1. For example, in an embodiment of FIG. 1, the first pixel circuit unit may include the driving transistor T1, the second transistor T2, the third transistor T3, the fourth transistor T4, the fifth transistor T5, the sixth transistor T6, the eighth transistor T8, the ninth transistor T9, the storage capacitor Cst, and the hold capacitor Chold.

Figure 2:
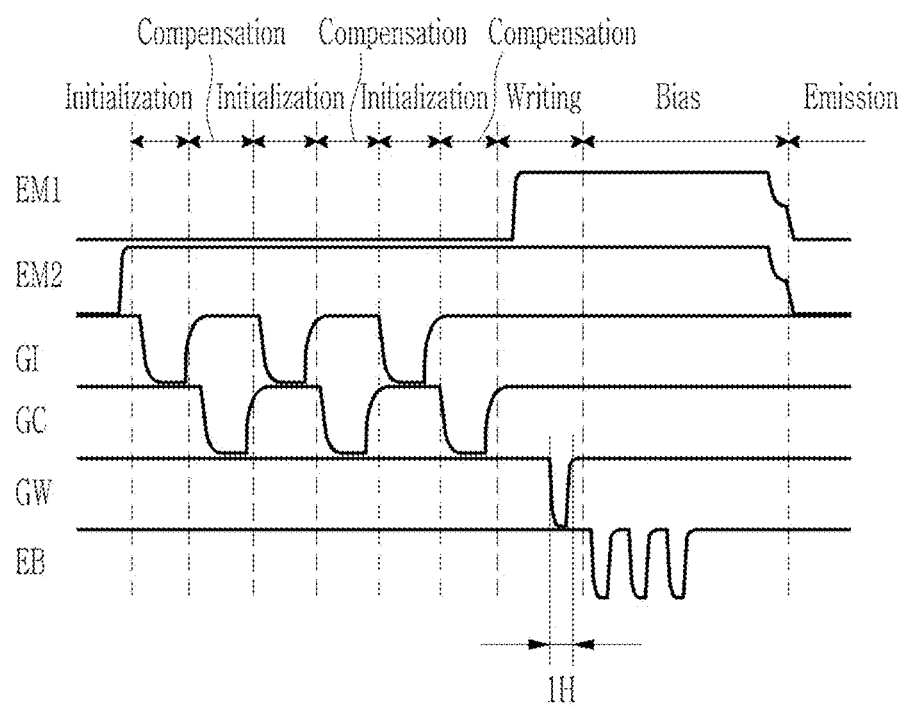
FIG. 2 illustrates a waveform diagram showing a signal applied to the display pixel of FIG. 1.

Hereinafter, an operation of a pixel in case that a signal of a waveform of FIG. 2 is applied to the pixel of FIG. 1 will be described.

FIG. 2 illustrates a waveform diagram showing a signal applied to the display pixel of FIG. 1.

Referring to FIG. 2, in case that signals applied to a pixel are divided into periods, they are divided into an initialization period, a compensation period, an entry period, and a bias period, and additionally, a period in which the first light emission control signal EM1(N) and the second light emission control signal EM2(N) have a low voltage is referred to as an emission period. In FIG. 2, the initialization period and the compensation period may be alternately included three times, but may be included only once each according to an embodiment.

First, an emission period is a period in which the light emitting diode LED emits light, and a gate-on voltage (low-level voltage) is applied by a first emission signal EM1 and a second emission signal EM2 to turn on the ninth transistor T9 and the sixth transistor T6. In case that the ninth transistor T9 is turned on so that the driving voltage ELVDD is transferred to the driving transistor T1, an output current is generated depending on a voltage of a gate electrode of the driving transistor T1. The output current of the driving transistor T1 is transmitted to the light emitting diode LED through the turned-on sixth transistor T6, to enable the light emitting diode LED to emit light. In FIG. 2, an emission period during which the first emission signal EM1 and the second emission signal EM2 apply the gate-on voltage (low-level voltage) is hardly illustrated, but in reality, the emission period has a longest time. However, the emission period is illustrated in FIG. 2 without detailed explanation because only the above operation is performed.

In case that the emission period ends, the initialization period is entered.

As the second emission signal EM2 is changed to a gate-off voltage (high-level voltage), an emission period ends, and a period in which the gate-off voltage of the second emission signal EM2 is applied includes an initialization period, a compensation period, a writing period, and a bias period. A gate-on voltage (low-level voltage) of the first emission signal EM1 is maintained.

The initialization period is a period in which a third scan signal GI(N) is changed to the gate-on voltage (low-level voltage), and the gate-on voltage (low-level voltage) is applied to the first emission signal EM1.

During the initialization period, the fourth transistor T4 receiving the third scan signal GI(N) is turned on to be initialized by changing the G-node (the first electrode of the storage capacitor Cst, the gate electrode of the driving transistor T1, and the second electrode of the third transistor T3) connected to the second electrode of the fourth transistor T4 to the first initialization voltage Vint. In an embodiment, the first initialization voltage Vint may be a low voltage capable of turning on the driving transistor T1. As a result, the driving transistor T1 may have a turn-on state while passing through the initialization period.

The ninth transistor T9 maintains a turn-on state by the first emission signal EM1, and the driving voltage ELVDD is transmitted to the first electrode of the driving transistor T1.

Thereafter, in case that the initialization period ends, the compensation period is entered.

As the third scan signal GI(N) is changed to the gate-off voltage (high-level voltage), the initialization period ends, and the second scan signal GC(N) is changed to the gate-on voltage (low-level voltage) to enter the compensation period. The gate-on voltage (low-level voltage) of the first emission control signal EM1(N) is also maintained.

During the compensation period, the third transistor T3 and the fifth transistor T5 to which a second scan signal GC(N) is applied are turned on, and the ninth transistor T9 to which the first emission control signal EM1(N) is applied is also maintained in the turn-on state.

The fifth transistor T5 is turned to change the D node (the second electrode of the storage capacitor Cst, the first electrode of the hold capacitor Chold, and the second electrode of the second transistor T2) connected to the second electrode of the fifth transistor T5 to the reference voltage Vref. Due to the reference voltage Vref, a voltage of the D-node becomes constant.

The ninth transistor T9 is turned on and the driving voltage ELVDD is transmitted to the driving transistor T1, and the third transistor T3 is turned on to form a structure (diode connection structure) in which the second electrode and the gate electrode of the driving transistor T1 are connected. During the initialization period, the driving transistor T1 is turned on due to the first initialization voltage Vint, and thus the driving voltage ELVDD is inputted to the first electrode of the driving transistor T1, but is outputted to the second electrode of the driving transistor T1 and transferred to the G-node (the gate electrode of the driving transistor T1 and the first electrode of the storage capacitor Cst) through the third transistor T3.

As a result, although the voltage of the gate electrode of the driving transistor T1 gradually increases as the first initialization voltage Vint increases, the driving transistor T1 is turned off at a threshold voltage of the driving transistor T1 to prevent the driving voltage ELVDD from flowing to the gate electrode of the driving transistor T1 any more. Accordingly, the voltage of the gate electrode of the driving transistor T1 has a threshold voltage value of the driving transistor T1.

After the compensation period as described above, the second electrode of the storage capacitor Cst has the reference voltage Vref, and the first electrode has a threshold voltage value of the driving transistor T1.

In FIG. 2, the above initialization period and the compensation period may be alternately performed two more times. Each of the periods operates twice more, and thus an initialization operation and a compensation operation may be performed more reliably so that an initialized or compensated voltage may be clearly stored in each of the capacitors Cst and Chole. However, according to an embodiment, the initialization period and the compensation period may be included only once, or may be included a variety of times.

In of FIG. 2, case that the third compensation period ends, the writing period is entered.

As the second scan signal GC(N) and the first emission control signal EM1(N) are changed to the gate-off voltage (high-level voltage), the compensation period ends, and the writing period is entered. Thereafter, the first scan signal GW(N) is changed to the gate-on voltage (low-level voltage) so that the data voltage Vdata is written into a display pixel.

During the writing period, the second transistor T2 receiving the first scan signal GW(N) is turned on so that the data voltage Vdata is inputted to the first electrode of the second transistor T2 and outputted to the second electrode, and thus the D-node (the second electrode of the storage capacitor Cst, the first electrode of the hold capacitor Chold, and the second electrode of the fifth transistor T5) connected to the second electrode of the second transistor T2 is changed to the data voltage Vdata.

An operation of the storage capacitor Cst will be described below.

The second electrode (D-node) of the storage capacitor Cst is maintained at the reference voltage Vref while passing through the compensation period, and changed to the data voltage Vdata. A voltage value of the first electrode (G-node) of the storage capacitor Cst is changed in proportion to a voltage change amount of the second electrode of the storage capacitor Cst. For example, the voltage change amount of the second electrode of the storage capacitor Cst is a voltage difference between the data voltage Vdata and the reference voltage Vref, and thus the voltage of the first electrode of the storage capacitor Cst is additionally changed from the threshold voltage by a value that is proportional to a voltage difference between the data voltage Vdata and the reference voltage Vref. The voltage value of the first electrode of the storage capacitor Cst may be decreased. The voltage value of the first electrode of the storage capacitor Cst is the same as the voltage value of the gate electrode of the driving transistor T1, and thus as much as the voltage of the gate electrode of the driving transistor T1 is lowered, a degree to which the driving transistor T1 is turned on during the emission period is determined, and a magnitude of the output current is determined.

In FIG. 2, the writing period may proceed for 1H, 1H may indicate one horizontal period, and one horizontal period may correspond to one horizontal synchronization signal Hsync. 1H may indicate a time for which a gate-on voltage is applied to a scan line of a next row after the gate-on voltage is applied to a scan line. Referring to FIG. 2, it can be checked that the initialization period, the compensation period, the bias period, and the emission period are longer than the writing period of 1H, and according to an embodiment, the compensation period may have a time of 3H or more so that the threshold voltage of the driving transistor T1 can be sufficiently compensated. For example, in case that a pixel separates the compensation period for compensating for a threshold voltage of the driving transistor T1 and the writing period for writing the data voltage Vdata and high-speed driving is performed by making a compensation time more than three times longer than the writing period 1H, although the time of 1H is very short, the compensation time is not insufficient so that sufficient compensation can be achieved during the high-speed driving by securing the time of 3H or more.

During the writing period, the voltage of the first electrode of the storage capacitor Cst, for example, the voltage of the gate electrode of the driving transistor T1, is changed by a value that is proportional to a voltage difference between the data voltage Vdata and the reference voltage Vref at a threshold voltage of the driving transistor T1, and thus it has a voltage value independent of the driving voltage ELVDD.

Accordingly, even in case that the driving voltage ELVDD is not constant depending on a position of the pixel, the voltage of the gate electrode of the driving transistor T1 of the pixel has no effect or a small effect so that display luminance does not change. Accordingly, each pixel may display constant luminance even if it is different according to the position of the driving voltage ELVDD.

In case that the writing period ends, the bias period is entered.

As the first scan signal GW(N) is changed to the gate-off voltage (high-level voltage), the compensation period ends, and the fourth scan signal EB(N) is changed to the gate-on voltage (low-level voltage) to enter the bias period. In FIG. 2, the fourth scan signal EB(N) has a structure in which the gate-on voltage (low-level voltage) and the gate-off voltage (high-level voltage) are repeated three times, but according to an embodiment, they may be repeated only once so that the gate-on voltage is applied once.

During the bias period, the seventh transistor T7 and the eighth transistor T8 receiving the fourth scan signal EB(N) are turned on.

First, the seventh transistor T7 is turned on to change a portion (the anode of the light emitting diode LED and the second electrode of the sixth transistor T6) connected to the second electrode of the seventh transistor T7 to the second initialization voltage Vaint. Accordingly, the bias period is also a period in which the anode of the light emitting diode LED is initialized, so it may also be referred to as an anode initialization period.

The eighth transistor T8 is turned on to change a portion (the first electrode of the driving transistor T1 and the second electrode of the ninth transistor T9) connected to the second electrode of the eighth transistor T8 to the bias voltage Vbias.

The voltage of the first electrode of the driving transistor T1 is maintained at the bias voltage Vbias to prevent a voltage relationship between terminals of the driving transistor T1 from being changed and to cause the drive transistor T1 to produce a constant output current. For example, in case that high or low frequency driving is performed, the driving transistor T1 may be required to generate an output current for a long time by using one data voltage Vdata that is inputted through the second transistor T2, but as time goes by, while as the voltage relationship of each terminal of the driving transistor T1 is changed, an output current may be changed. However, the bias voltage Vbias is periodically applied to prevent the voltage relationship of the driving transistor T1 from being changed and to keep the output current constant.

The bias voltage Vbias may have a constant voltage level, and different voltages may be set for each device according to characteristics of the emissive display device.

In the above, a circuit structure and an operation of a pixel have been described.

Hereinafter, a planar structure of a pixel circuit unit in a pixel according to an embodiment will be described in detail with reference to FIG. 3 to FIG. 10. For example, the light emitting diode LED is not illustrated in FIG. 3 to FIG. 10 below, but the structure of the pixel circuit unit positioned below the light emitting diode LED will be described.

FIG. 3 to FIG. 10 each illustrate a schematic top plan view of each layer depending on a manufacturing order of a display pixel according to an embodiment.

Figure 3:
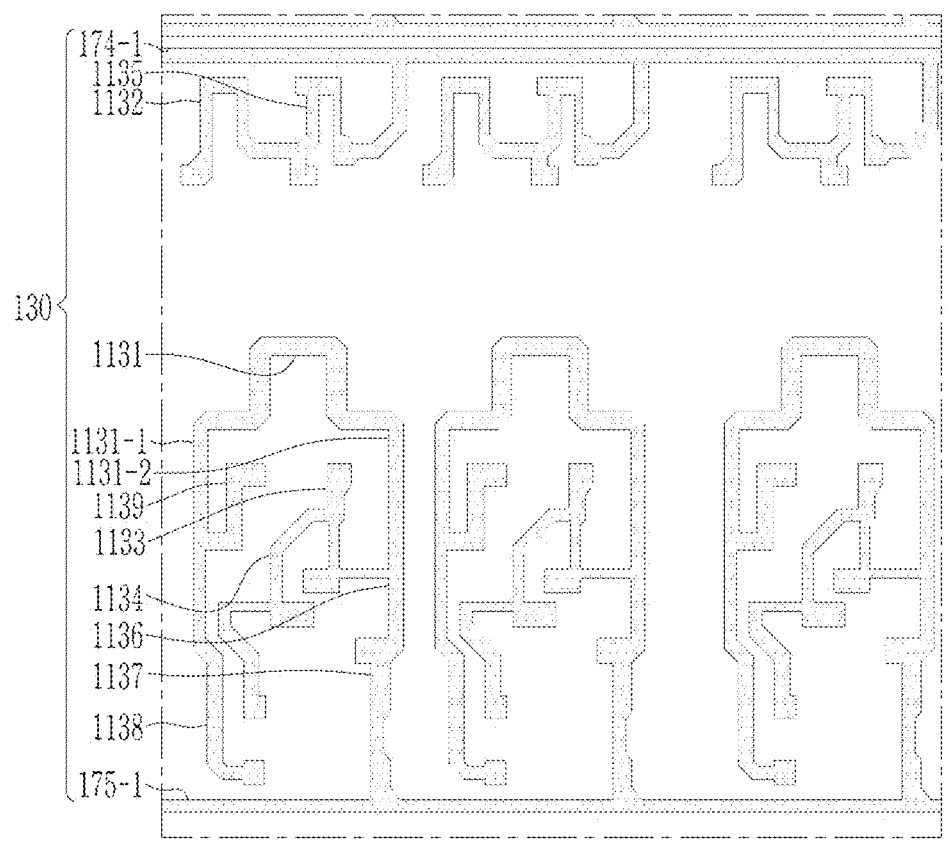
FIG. 3 to FIG. 10 each illustrate a schematic plan view of each layer depending on a manufacturing order of a display pixel according to an embodiment.
Figure 3:
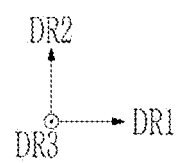
Figure 11:
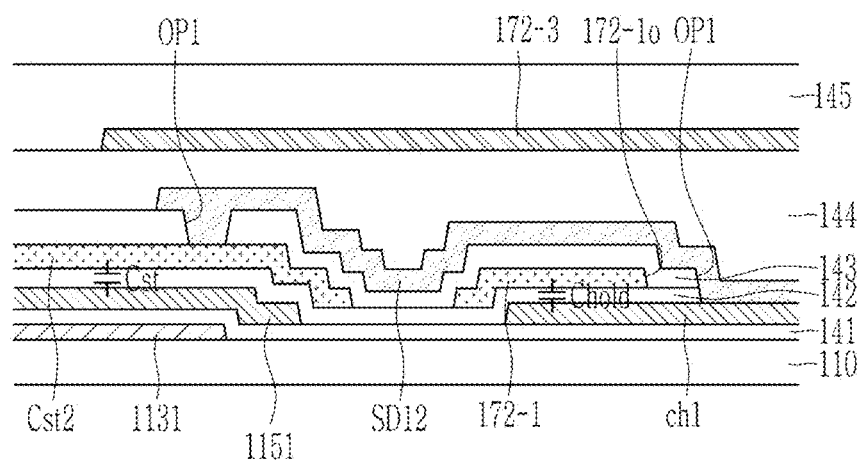
FIG. 11 illustrates a partial schematic cross-sectional view of an emissive display device according to an embodiment.

First, referring to FIG. 3, a semiconductor layer 130 is disposed on a substrate 110 (see FIG. 11).

Herein, the substrate 110 may include a material that has a rigid property such as glass so as to not bend, or may include a flexible material that can be bent, such as plastic or a polyimide. In the case of a flexible substrate, it may have a structure in which a two-layer structure of a polyimide and a barrier layer formed of an inorganic insulating material thereon is doubly formed.

The semiconductor layer 130 may be formed of a silicon semiconductor (for example, a polycrystalline semiconductor), and may be formed of an oxide semiconductor or an amorphous semiconductor according to an embodiment. A portion of the semiconductor layer 130 may have same or similar characteristics as the conductor by plasma treatment or being doped with impurities, so that charges may be transferred. A channel portion of a transistor of the semiconductor layer 130 may not be doped with impurities.

The semiconductor layer 130 includes semiconductors 1131, 1132, 1133, 1134, 1135, 1136, 1137, 1138, and 1139 included in each transistor, and additionally, a first reference voltage line 174-1 to which the reference voltage Vref is applied and a second-1 initialization voltage line 175-1 to which the second initialization voltage Vaint is applied are also included. In the semiconductor layer 130, the first reference voltage line 174-1 and the second-1 initialization voltage line 175-1 extend in a first direction DR1 (hereinafter also referred to as a horizontal direction), and it may be doped to have a characteristic comparable to this of a conductor.

The driving transistor T1 includes a first semiconductor 1131, the second transistor T2 includes a second semiconductor 1132, the third transistor T3 includes a third semiconductor 1133, the fourth transistor T4 includes a fourth semiconductor 1134, the fifth transistor T5 includes a fifth semiconductor 1135, the sixth transistor T6 includes a sixth semiconductor 1136, the seventh transistor T7 includes a seventh semiconductor 1137, and the ninth transistor T9 includes the ninth semiconductor 1139. In FIG. 3, the first semiconductor 1131 of the driving transistor T1 may include a first region 1131-1 and a second region 1131-2, the first region 1131-1 may correspond to the first electrode of the driving transistor T1, and the second region 1131-2 may correspond to the second electrode of the driving transistor T1. A channel region of the driving transistor T1 may be positioned between the first region 1131-1 and the second region 1131-2 of the first semiconductor 1131. Referring to FIG. 3, the first semiconductor 1131 of the driving transistor T1 may have a bent structure to have an omega (Ω) shape, and the first region 1131-1 extends to be connected to the eighth semiconductor 1138 and the ninth semiconductor 1139. The second region 1131-2 may extend to be connected to the third semiconductor 1133 and the sixth semiconductor 1136, the third semiconductor 1133 may further extend to be connected to the fourth semiconductor 1134, the sixth semiconductor 1136 may further extend to be connected to the seventh semiconductor 1137, and the seventh semiconductor 1137 may further extend to be connected to the second-1 initialization voltage line 175-1.

In the semiconductor layer 130, the second semiconductor 1132, the fifth semiconductor 1135, and the first reference voltage line 174-1 may be separated from the first semiconductor 1131 and the like within the spirit and the scope of the disclosure. According to FIG. 3, the second semiconductor 1132 and the fifth semiconductor 1135 each have a structure that is bent in an n-shape, and the second semiconductor 1132 and the fifth semiconductor 1135 may be connected to each other. The fifth semiconductor 1135 may extend to be connected to the first reference voltage line 174-1.

The semiconductors 1132, 1133, 1134, 1135, 1136, 1137, 1138, and 1139 included in the second transistor T2 to the ninth transistor T9 may each include a first region and a second region, the first region may correspond to the first electrode, and the second region may correspond to the second electrode. A channel region of each transistor may be positioned between the first region and the second region.

Referring to FIG. 11, a first gate insulating layer 141 may be disposed on the first semiconductor layer 130. The first gate insulating layer 141 may include an inorganic insulating layer including a silicon oxide ($SiO_x$), a silicon nitride ($SiN_x$), a silicon oxynitride ($SiO_xN_y$), or the like within the spirit and the scope of the disclosure.

Figure 4:
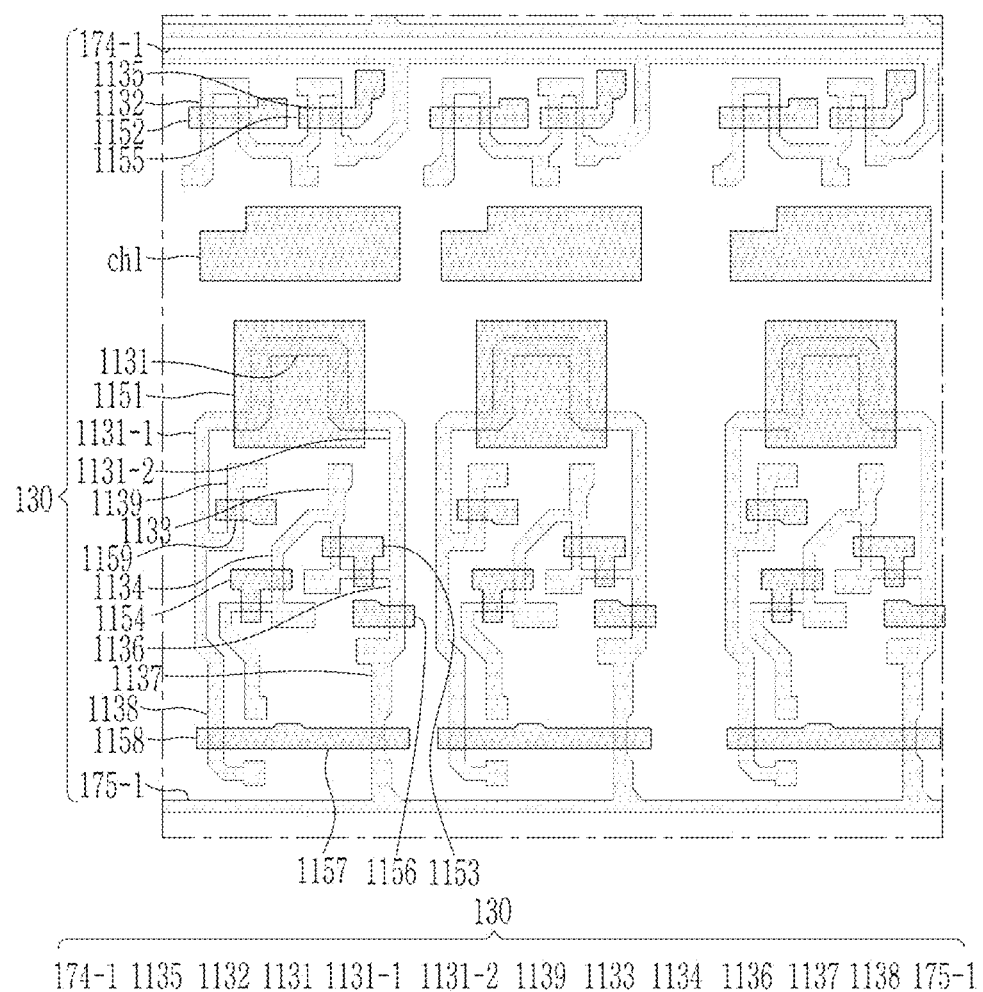

Referring to FIG. 4, a first gate conductive layer including a gate electrode 1151 (hereinafter referred to as a driving gate electrode) of the driving transistor T1 may be disposed on the first gate insulating layer 141. The gate electrode 1151 of the driving transistor T1 may correspond to one of the G-nodes.

A first gate conductive layer includes gate electrodes 1152, 1153, 1154, 1155, 1156, 1157, 1158, and 1159 of the second to ninth transistors T2 to T9 as well as the gate electrode 1151 of the driving transistor T1. For example, the second transistor T2 includes the second gate electrode 1152, the third transistor T3 includes the third gate electrode 1153, the fourth transistor T4 includes the fourth gate electrode 1154, the fifth transistor T5 includes the fifth gate electrode 1155, the sixth transistor T6 include the sixth gate electrode 1156, the seventh transistor T7 include the seventh gate electrode 1157, the eighth transistor T8 include the eighth gate electrode 1158, and the ninth transistor T9 include the ninth gate electrode 1159. Referring to FIG. 4, the seventh gate electrode 1157 and the eighth gate electrode 1158 may be connected to each other, and may extend in the first direction DR1. A portion of the semiconductor layer 130 overlapping each of the gate electrodes is positioned in a channel region of each transistor, and a first region and a second region are positioned at opposite sides thereof.

Additionally, the first gate conductive layer may also include a first electrode ch1 of the hold capacitor Chold. The first electrode ch1 of the hold capacitor Chold is positioned in a portion where the semiconductor layer 130 is not formed. The first electrode ch1 of the hold capacitor Chold may correspond to one of the D-nodes.

The first gate conductive layer may include a metal such as copper (Cu), molybdenum (Mo), aluminum (Al), titanium (T1), or a metal alloy thereof, and may be a single layer or a multi-layer.

After forming the first gate conductive layer, a plasma treatment or doping process may be performed to make a portion of the semiconductor layer 130 that is not covered with the first gate conductive layer conductive. For example, the semiconductor layer 130 covered by the first gate conductive layer may not be conductive, and a portion of the semiconductor layer 130 not covered by the first gate conductive layer may have a same characteristic as that of the conductive layer.

Referring to FIG. 11, a second gate insulating layer 142 may be positioned on the first gate conductive layer and the first gate insulating layer 141. The second gate insulating layer 142 may include an inorganic insulating layer including a silicon oxide ($SiO_x$), a silicon nitride ($SiN_x$), a silicon oxynitride ($SiON_x$), or the like within the spirit and the scope of the disclosure.

Figure 5:
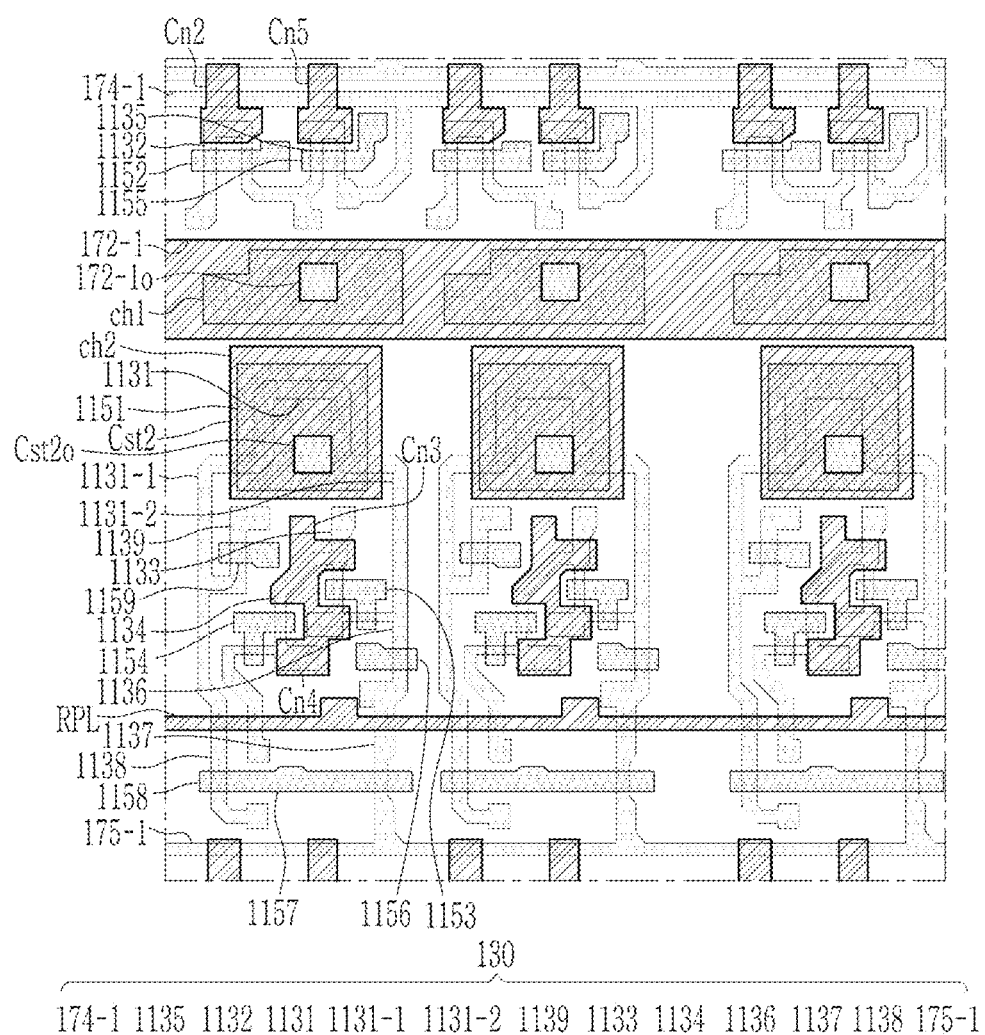

Referring to FIG. 5, a second gate conductive layer may be disposed on the second gate insulating layer 142.

The second gate conductive layer includes a first driving voltage line 172-1, a second electrode Cst2 of the storage capacitor Cst, and overlapping electrodes Cn2, Cn3, Cn4, and Cn5.

The first driving voltage line 172-1 is a wire that extends in a first direction, has a wide width so as to overlap the first electrode ch1 of the hold capacitor Chold in a plan view, and receives the driving voltage ELVDD. The first driving voltage line 172-1 includes an opening 172-1o overlapping a portion of the first electrode ch1 of each hold capacitor Chold. The second gate insulating layer 142 disposed between the first driving voltage line 172-1 and the first electrode ch1 of the hold capacitor Chold in a schematic cross-sectional view also has an opening (see FIG. 6) at a portion corresponding to the opening 172-1o of the first driving voltage line 172-1, so that the first electrode ch1 of the hold capacitor Chold is exposed upward to be formed to be connected to the upper conductive layer. The first driving voltage line 172-1 overlapping the first electrode ch1 of the hold capacitor Chold and the second gate insulating layer 142 positioned therebetween constitute the hold capacitor (Chold) of FIG. 1, and a portion of the first driving voltage line 172-1 overlapping the first electrode ch1 of the hold capacitor Chold in a plan view corresponds to the second electrode of the hold capacitor Chold.

A second electrode Cst2 of the storage capacitor Cst may be larger than the gate electrode 1151 of the driving transistor T1. The second electrode Cst2 of the storage capacitor Cst includes an opening Cst2o overlapping a portion of the gate electrode 1151 of the driving transistor T1. The second gate insulating layer 142 positioned between the cross-section of the second electrode Cst2 of the storage capacitor Cst and the gate electrode 1151 of the driving transistor T1 also has an opening (see FIG. 6) at a portion corresponding to the opening Cst2o of the second electrode Cst2 of the storage capacitor Cst, so that the gate electrode 1151 of the driving transistor T1 is exposed upward to be formed to be connected to the upper conductive layer. The gate electrode 1151 of the driving transistor T1 overlapping the second electrode Cst2 of the storage capacitor Cst and the second gate insulating layer 142 disposed therebetween constitute the storage capacitor Cst of FIG. 1, and the gate electrode 1151 of the driving transistor T1 is the gate electrode of the driving transistor T1 and also the first electrode of the storage capacitor Cst.

Each of the overlapping electrodes Cn2, Cn3, Cn4, and Cn5 overlaps a portion of the semiconductor layer 130 to form an additional capacitor. For example, the overlapping electrode Cn2 for the second transistor T2 overlaps a portion of the second semiconductor 1132 that does not overlap the second gate electrode 1152 to form an additional capacitor with the corresponding semiconductor. The overlapping electrode Cn3 for the third transistor T3 overlaps a portion of the third semiconductor 1133 that does not overlap the third gate electrode 1153 to form an additional capacitor with the corresponding semiconductor. For example, the overlapping electrode Cn4 for the fourth transistor T4 overlaps a portion of the fourth semiconductor 1134 that does not overlap the fourth gate electrode 1154 to form an additional capacitor with the corresponding semiconductor. The overlapping electrode Cn3 for the third transistor T3 and the overlapping electrode Cn4 for the fourth transistor T4 may extend to be integral. The overlapping electrode Cn5 for the fifth transistor T5 overlaps a portion of the fifth semiconductor 1135 that does not overlap the fifth gate electrode 1155 to form an additional capacitor with the corresponding semiconductor. The additional capacitor as described above is not illustrated in FIG. 1, and may be omitted from FIG. 1 because it may not greatly affect an operation of the pixel. The additional capacitor as described above prevents the voltage characteristics of the semiconductor layer 130 overlapping each of the overlapping electrodes Cn2, Cn3, Cn4, and Cn5 from being changed, and protects (shields) from voltage fluctuations in other portions. According to an embodiment, each of the overlapping electrodes Cn2, Cn3, Cn4, and Cn5 and the additional capacitor may be omitted.

The second gate conductive layer according to FIG. 5 further includes a repair line RPL extending in the first direction. In case that a pixel has a defect, the repair line RPL may be short-circuited with a portion (for example, a portion connected to the anode of the light emitting diode (LED) with the conductive layer (SD14 in FIG. 7 or SD21 in FIG. 9) positioned at an upper portion) of the pixel, and a constant current may be applied to the light emitting diode to emit light. Herein, a current transferred through the repair line RPL is generated in the repair pixel, and the repair pixel will be described with reference to FIG. 12 to FIG. 21.

The second gate conductive layer may include a metal such as copper (Cu), molybdenum (Mo), aluminum (Al), titanium (T1), or a metal alloy thereof, and may be a single layer or a multi-layer.

Referring to FIG. 11, a first interlayer insulating layer 143 may be positioned on the second gate conductive layer. The first interlayer insulating layer 143 may include an inorganic insulating layer including a silicon oxide ($SiO_x$), a silicon nitride ($SiN_x$), a silicon oxynitride ($SiO_xN_y$), or the like, and according to an embodiment, an inorganic insulating material may be thickly formed, or may include an organic material according to an embodiment.

Figure 6:
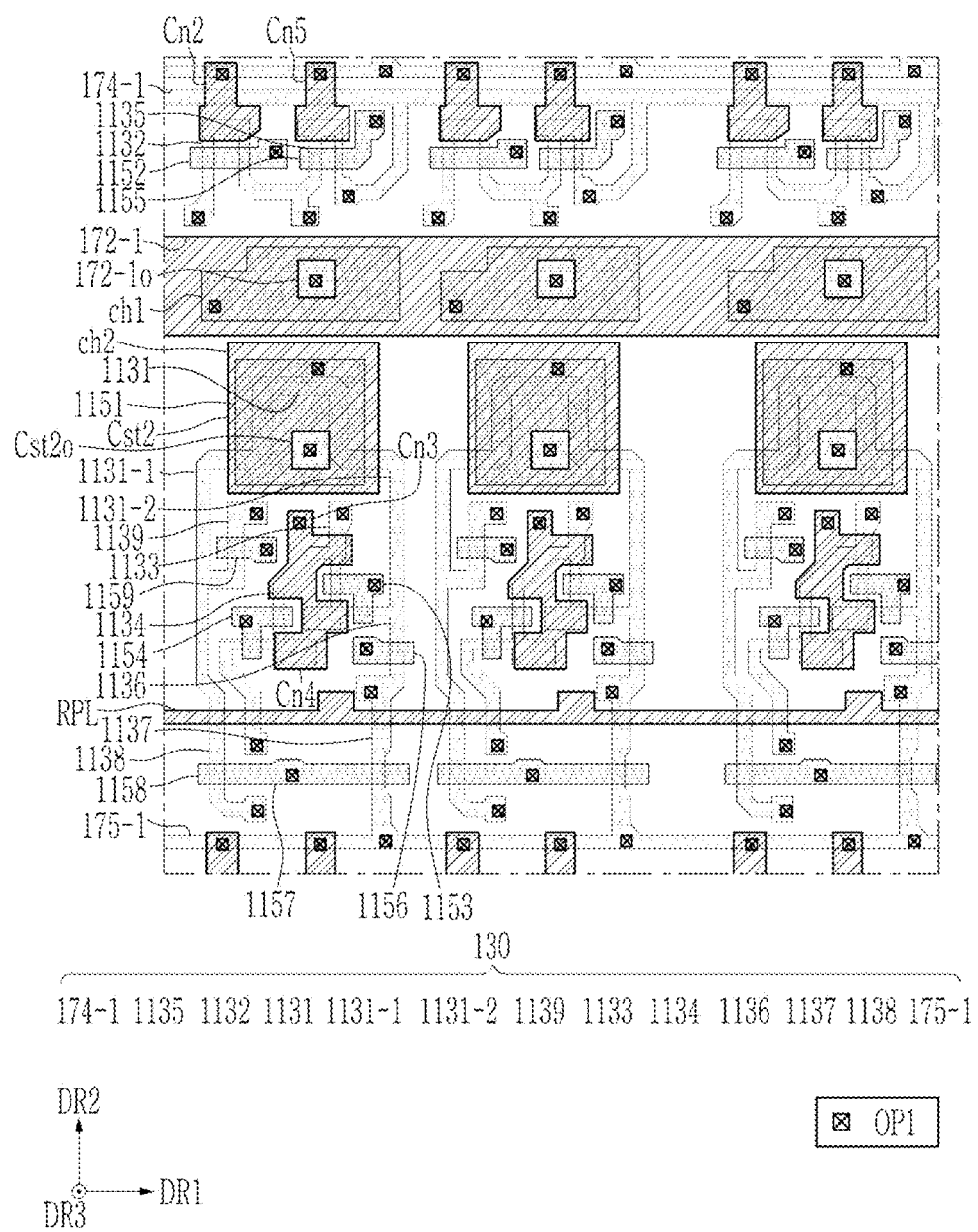

Referring to FIG. 6, an opening OP1 is formed in an insulating layer such as the first interlayer insulating layer 143.

The opening OP1 is an opening formed in at least one of the first interlayer insulating layer, the second gate insulating layer 142, and the first gate insulating layer 141, and the semiconductor layer 130 and the first gate conductive layer or the second gate conductive layer are exposed at an upper portion to be connected to the first data conductive layer disposed on the first interlayer insulating layer 143. By way of example, among the openings OP1 of FIG. 6, the opening OP1 overlapping only the semiconductor layer 130 is integral in the first interlayer insulating layer 143, the second gate insulating layer 142, and the first gate insulating layer 141 to expose the semiconductor layer 130. Among the openings OP1, the opening OP1 overlapping the first gate conductive layer is integral in the first interlayer insulating layer 143 and the second gate insulating layer 142 to expose the first gate conductive layer. The opening OP1 exposing the first gate conductive layer also overlaps openings 172-10 and Cst2o positioned in the first driving voltage line 172-1 of the second gate conductive layer and the second electrode Cst2 of the storage capacitor Cst, respectively, to expose the lower first gate conductive layer, for example, the first electrode ch1 of the hold capacitor Chold and the gate electrode 1151 of the driving transistor T1. Among the openings OP1, an opening OP1 overlapping the second gate conductive layer is formed in the first interlayer insulating layer 143 to expose the second gate conductive layer.

Figure 7:
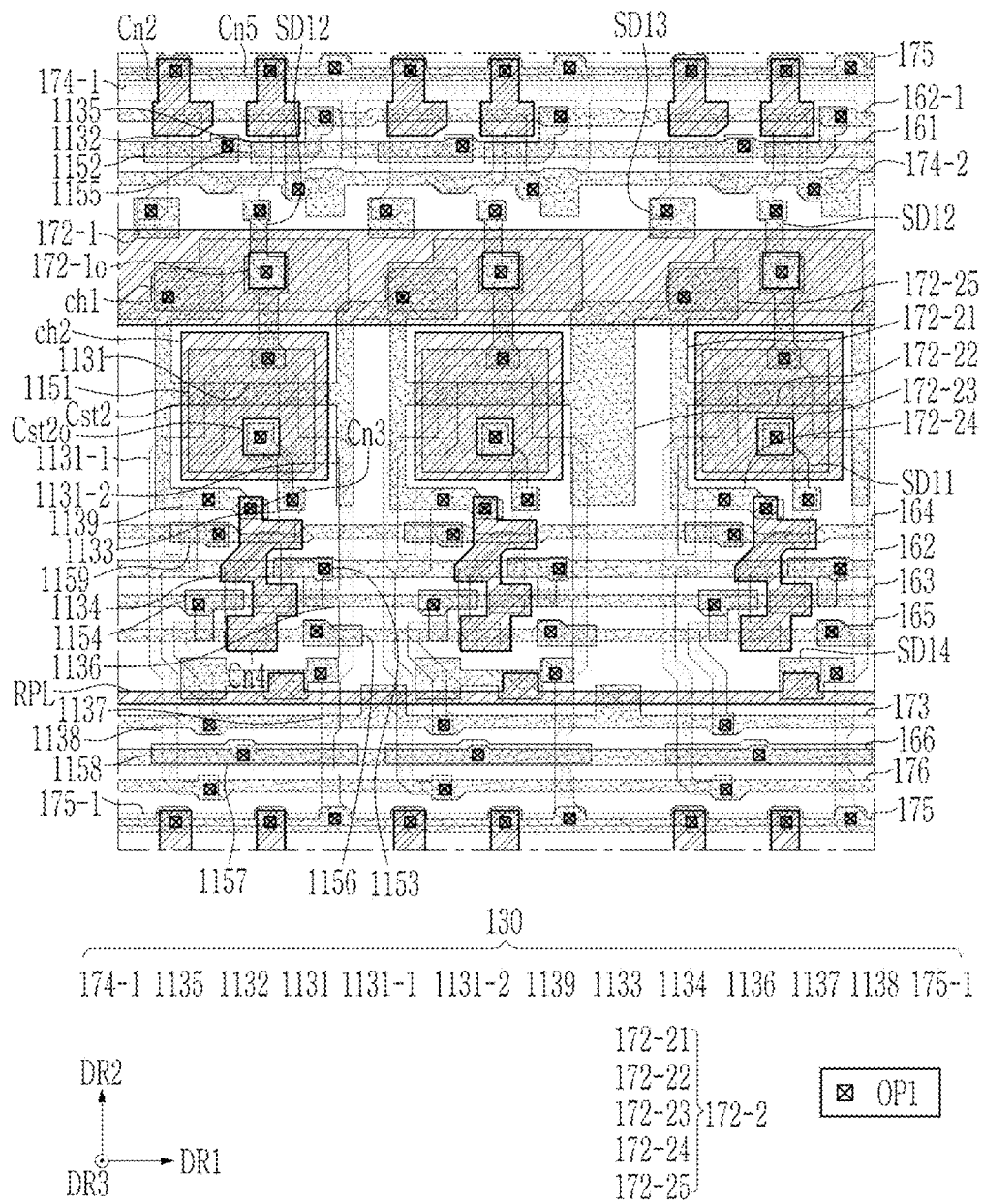

Referring to FIG. 7, a first data conductive layer may be disposed on the first interlayer insulating layer 143.

The first data conductive layer of FIG. 7 may include a voltage line to which a constant voltage is applied, a signal line to which a signal (a scan signal or an emission signal) that is changed for each frame may be inputted, and a connecting layer.

Voltage lines to which a constant voltage is applied in the first data conductive layer of FIG. 7 may include a second driving voltage line 172-2, a first initialization voltage line 173, a second reference voltage line 174-2, a second initialization voltage line 175, and a bias voltage line 176.

Signal lines to which a scan signal can be input for each frame in the first data conductive layer of FIG. 7 may include a first scan line 161 to which the first scan signal GW(N) is applied, second scan lines 162 and 162-1 to which the second scan signal GC(N) is applied, a third scan line 163 to which the third scan signal GI(N) is applied, a first emission signal line 164 to which the first emission control signal EM1(N) is applied, a second light emission signal line 165 to which the second light emission control signal EM2(N) is applied, and a fourth scan line 166 to which the fourth scan signal EB(N) is applied.

In the first data conductive layer of FIG. 7, connecting layers may include a first connecting layer SD11, a second connecting layer SD12, a third connecting layer SD13, and a fourth connecting layer SD14.

First, the voltage lines of the first data conductive layer will be described.

The second driving voltage line 172-2 (hereinafter also referred to as the driving voltage line positioned in the first data conductive layer) extends in the first direction while being bent, and includes a vertical portion 172-21, a horizontal portion 172-22, a shielding portion 172-23, a connecting portion 172-24, and an expanding portion 172-25.

The vertical portion 172-21 is connected to the connecting portion 172-24 and the expanding portion 172-25 at opposite sites, respectively, while extending in a direction that is perpendicular to the first direction DR1 (also referred to as the second direction DR2 or a vertical direction), and a middle portion thereof is a portion connected to the horizontal portion 172-22. The horizontal portion 172-22 has a structure that extends from a middle portion of the vertical portion 172-21 in the first direction DR1 and connected to the shielding portion 172-23, and the shielding portion 172-23 extends in the second direction DR2, overlaps a portion of the semiconductor layer 130, shields the semiconductor layer 130, and extends to form the expanding portion 172-25 and the vertical portion 172-21 is connected. A portion of the shielding portion 172-23 may have a structure having an extended width to constitute an expanded shielding portion.

The vertical portion 172-21 and the shielding portion 172-23 of the second driving voltage line 172-2 extends in the second direction and overlaps a portion of the semiconductor layer 130 to shield the semiconductor layer 130. By way of example, the vertical portion 172-21 may overlap and shield the first region 1131-1 and portions of the eighth semiconductor 1138 and the ninth semiconductor 1139 extending from the first region 1131-1 in the first semiconductor 1131. The shielding portion 172-23 may overlap and shield the second region 1131-2 and portions of the third semiconductor 1133 and the sixth semiconductor 1136 extending from the second region 1131-2 in the first semiconductor 1131. As a result, voltages of the first electrode and the second electrode of the driving transistor T1 and an electrode of the transistor connected thereto may have a characteristic of receiving an electric field from an external influence.

The second driving voltage line 172-2 may additionally extend in the first direction from the end of the vertical portion 172-21, and may further include a connecting portion 172-24 connected to the ninth semiconductor 1139 of the ninth transistor T9 and the overlapping electrode Cn3 for the third transistor T3 through the opening OP1. As a result, the driving voltage ELVDD may be transferred to the first electrode of the ninth transistor T9, and the driving voltage ELVDD is transferred to the overlapping electrode Cn3 for the third transistor T3 and the overlapping electrode Cn4 for the fourth transistor T4 integral therewith. As a result, a voltage at a first side of the additional capacitor is maintained at the driving voltage ELVDD, and thus a voltage of the semiconductor layer 130 overlapping the overlapping electrode Cn3 for the third transistor T3 and the overlapping electrode Cn4 for the fourth transistor T4 may be maintained constant.

The second driving voltage line 172-2 may further include an expanding portion 172-25 connected to the vertical portion 172-21 and the shielding portion 172-23. The expanding portion 172-25 is connected to the first driving voltage line 172-1 through the opening OP1.

The first initialization voltage line 173 extends in the first direction, and is connected to the fourth semiconductor 1134 through the opening OP1 to transfer the first initialization voltage Vint to the first electrode of the fourth transistor T4.

The second reference voltage line 174-2 extends in the first direction, and is connected to the fifth semiconductor 1135 through the opening OP1 to transfer the reference voltage Vref to the first electrode of the fifth transistor T5. The first reference voltage line 174-1 extending from the fifth semiconductor 1135 may also be positioned in the semiconductor layer 130, and the reference voltage Vref may be transmitted through the semiconductor layer and the first data conductive layer.

The second initialization voltage line 175 may extend in the first direction DR1, and may be connected to the second-1 initialization voltage line 175-1 positioned in the semiconductor layer 130 through the opening OP1 to transfer the second initialization voltage Vaint through the semiconductor layer and the first data conductive layer. The second initialization voltage line 175 may also be connected to the overlapping electrode Cn2 for the second transistor T2 and the overlapping electrode Cn5 for the fifth transistor T5 through the opening OP1. As a result, a voltage at a first side of the additional capacitor may be maintained at the second initialization voltage Vaint, and thus a voltage of the semiconductor layer 130 overlapping the overlapping electrode Cn2 for the second transistor T2 and the overlapping electrode Cn5 for the fifth transistor T5 may be maintained constant.

The first initialization voltage line 176 extends in the first direction, and is connected to the eighth semiconductor 1138 through the opening OP1 to transfer the bias voltage Vbias to the first electrode of the eighth transistor T8.

The signal lines in the first data conductive layer will be described as follows.

The first scan line 161 to which the first scan signal GW(N) is applied extends in the first direction DR1, and is connected to the second gate electrode 1152 through the opening OP1.

The second scan lines 162 and 162-1 to which the second scan signal GC(N) is applied are divided into two lines extending in the first direction DR1. The second-1 scan line 162 extends in the first direction DR1 and is connected to the third gate electrode 1153 through the opening OP1, and the second-2 scan line 162-1 extends in the first direction DR1 and is connected to the fifth gate electrode 1155 through the opening OP1. According to an embodiment, two second scan lines 162 and 162-1 may be formed into one, or scan signals having different timings may be applied to the two second scan lines 162 and 162-1.

The third scan line 163 to which the third scan signal GI(N) is applied extends in the first direction DR1, and is connected to the fourth gate electrode 1154 through the opening OP1.

The first emission signal line 164 to which the first emission control signal EM1(N) is applied extends in the first direction DR1 and is connected to the ninth gate electrode 1159 through the opening OP1, and the second emission signal line 165 to which the second emission control signal EM2(N) is applied extends in the first direction DR1 and is connected to the sixth gate electrode 1156 through the opening OP1.

The first scan line 166 to which the fourth scan signal EB(N) is applied may extend in the first direction DR1, and may be connected to the seventh gate electrode 1157 and the eighth gate electrode 1158 that are integral through the opening OP1.

The connecting layer in the first data conductive layer will be described below.

A first end of the first connecting layer SD11 is connected to the gate electrode 1151 of the driving transistor T1 through the opening OP1, and a second end is connected to the third semiconductor 1133 through the opening OP1. As a result, the gate electrode 1151 of the driving transistor T1 and the second electrode of the third transistor T3 are connected by the first connecting layer SD11. In case that the first connecting layer SD11 and the gate electrode 1151 of the driving transistor T1 are connected through the opening OP1, they are connected through an opening Cst2o located or disposed in the second electrode Cst2 of the storage capacitor Cst. For example, the opening OP1 is positioned within the opening Cst2o of the second electrode Cst2 of the holding capacitor Cst. The first connecting layer SD11 may also correspond to one of the G-nodes.

A first end of the second connecting layer SD12 is connected to the second electrode Cst2 of the storage capacitor Cst through the opening OP1, a middle end thereof is connected to the first electrode ch1 of the hold capacitor Chold through the opening OP1, and a second end thereof is connected to a protruding portion between the second semiconductor 1132 and the fifth semiconductor 1135 through the opening OP1. As a result, a second electrode of the storage capacitor Cst, a first electrode of the hold capacitor Chold, and the D-node of FIG. 1 where a second electrode of the second transistor T2 and a second electrode of the fifth transistor T5 are connected to each other is formed by the second connecting layer SD12. Accordingly, the second connecting layer SD12 may also correspond to one of the D-nodes, and the second semiconductor 1132 and the fifth semiconductor 1135 positioned on the semiconductor layer 130, the first electrode ch1 of the hold capacitor Chold positioned on the first gate conductive layer, and a second electrode of the storage capacitor Cst positioned on the second gate conductive layer are connected by the second connecting layer SD12 positioned on the first data conductive layer. In case that the second connecting layer SD12 and the first electrode ch1 of the hold capacitor Chold are connected through the opening OP1, they are connected through the opening 172-10 positioned in the first driving voltage line 172-1. For example, the opening OP1 is positioned within the opening 172-10 of the first driving voltage line 172-1.

The third connecting layer SD13 is connected to the second semiconductor 1132 through the opening OP1. The third connecting layer SD13 is connected to the data line 171 of the second data conductive layer, which will be described later, so that the data voltage Vdata is transferred to the first electrode of the second transistor T2.

The fourth connecting layer SD14 is connected to a protruding portion between the sixth semiconductor 1136 and the seventh semiconductor 1137 through the opening OP1. The fourth connecting layer SD14 is a portion for connecting the second electrode of the sixth transistor T6 and the second electrode of the seventh transistor T7 to be connected to the anode of the light emitting diode LED. A position of an anode of the light emitting diode LED may be different for each pixel, and as illustrated in FIG. 7, each fourth connecting layer SD14 may have a different shape for each adjacent pixel.

A first data conductive layer may include a metal such as aluminum (Al), copper (Cu), molybdenum (Mo), titanium (T1), or a metal alloy thereof, and may be a single layer or a multi-layer.

Referring to FIG. 11, a first organic layer 144 may be positioned on the first data conductive layer. The first organic layer 144 may be an organic insulating layer including an organic material, and may include at least one material of a polyimide, a polyamide, an acrylic resin, benzo cyclobutene, and a phenol resin as an organic material.

Figure 8:
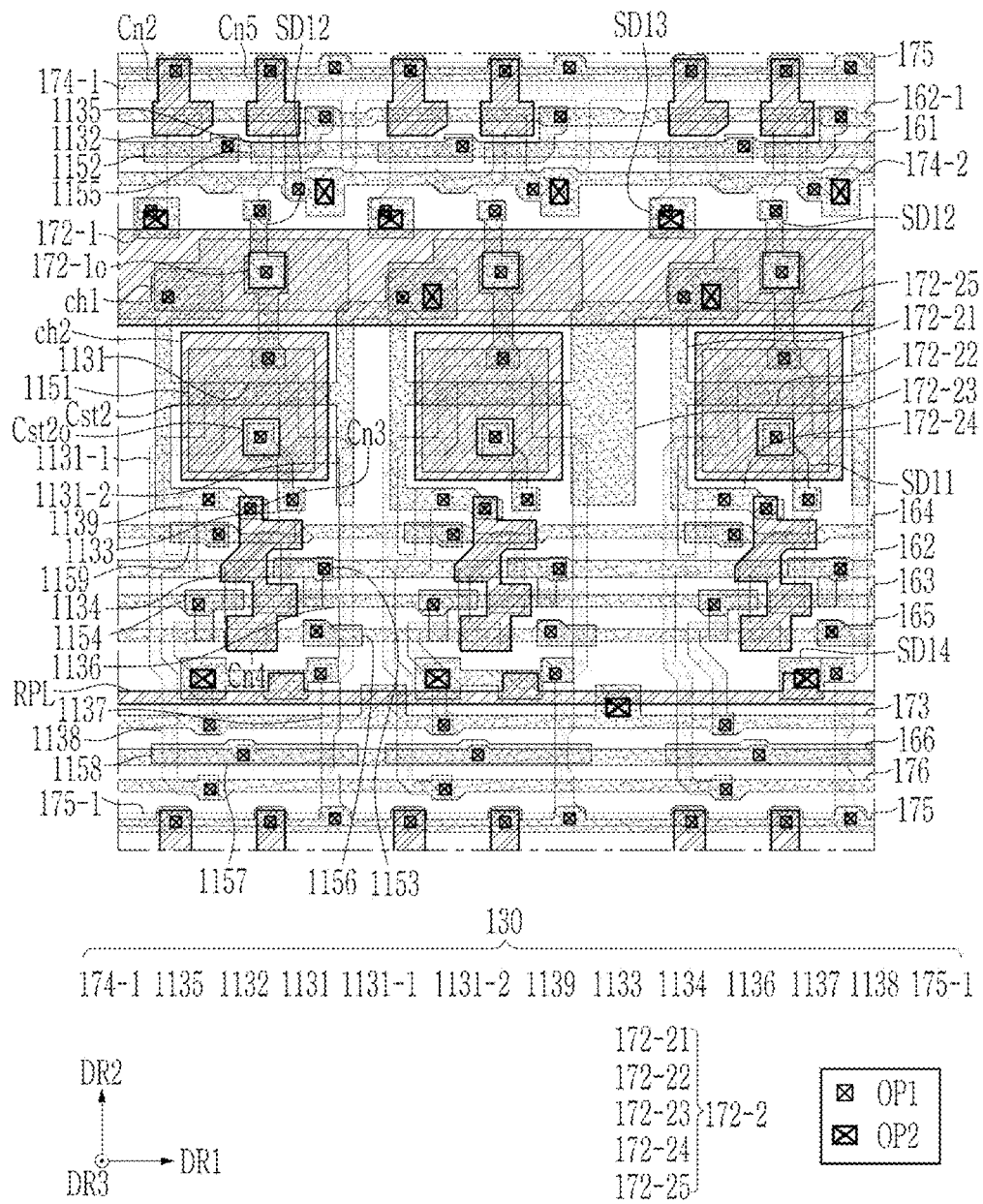

Referring to FIG. 8, an opening OP2 is positioned in the first organic layer 144. The opening OP2 exposes the first data conductive layer and is connected to the second data conductive layer.

Figure 9:
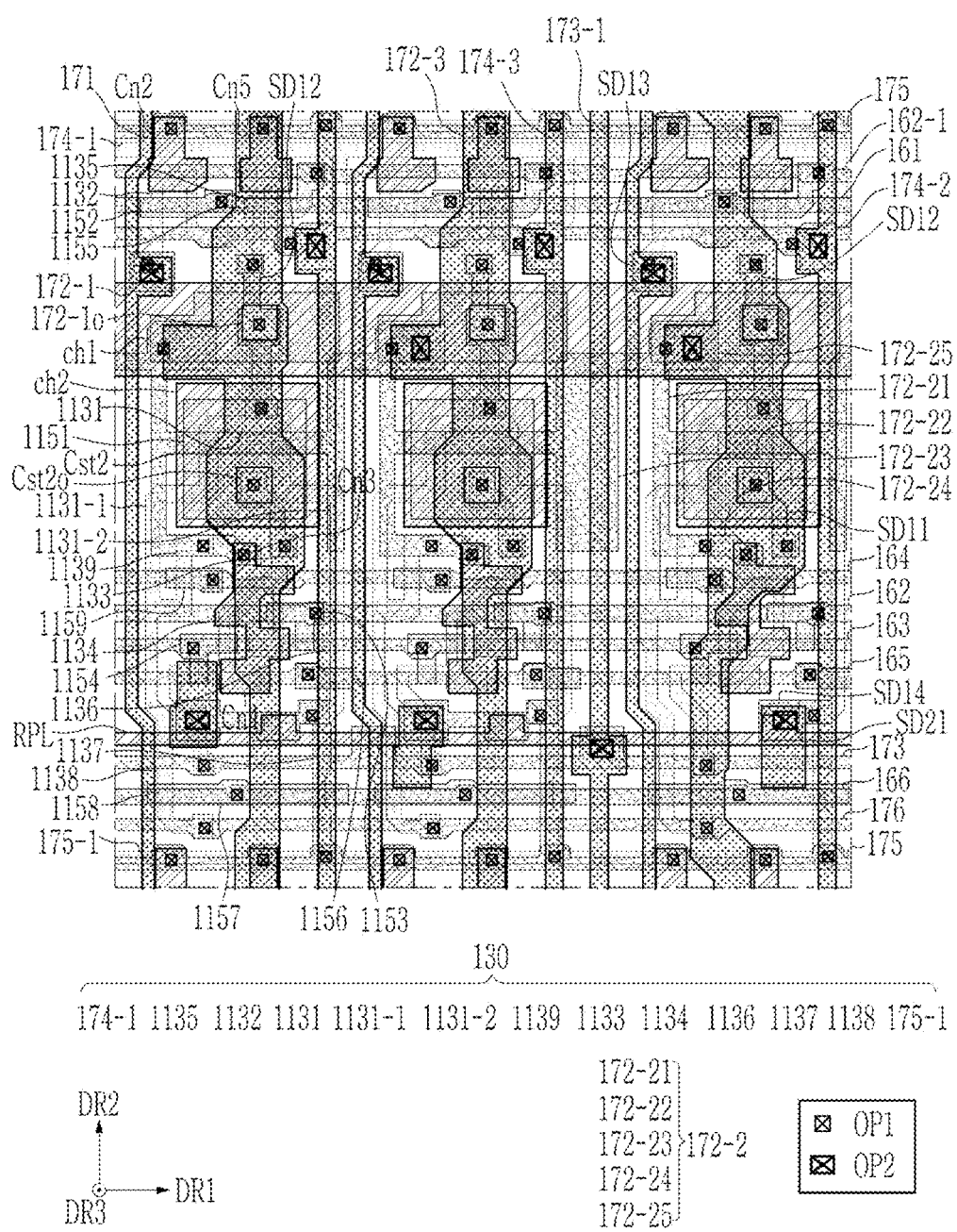

Referring to FIG. 9, the second data conductive layer may be disposed on the first organic layer 144.

The second data conductive layer may include a data line 171 to which the data voltage Vdata is applied, a third driving voltage line 172-3 to which the driving voltage ELVDD is transmitted, a third reference voltage line 174-3 to which the reference voltage Vref is transmitted, and a fifth connecting layer SD21.

The data line 171 extends in the second direction DR2 and is connected to the third connecting layer SD13 through the opening OP2, and since the third connecting layer SD13 is connected to the second semiconductor 1132 through the opening OP1, the data voltage Vdata is transferred to the first electrode of the second transistor T2 through the third connecting layer SD13.

The third driving voltage line 172-3 extends in the second direction DR2 and is connected to the extension 172-25 of the second driving voltage line 172-2 through the opening OP2. The extension 172-25 of the second driving voltage line 172-2 is also connected to the first driving voltage line 172-1 through the opening OP1, and thus the driving voltage ELVDD is transferred in the second direction DR2 through the third driving voltage line 172-3, and is also transferred in the first direction DR1 through the second driving voltage line 172-2 and the first driving voltage line 172-1. Due to the driving voltage line having such a mesh structure, the driving voltage ELVDD may have a constant voltage value throughout the emissive display device.

The third reference voltage line 174-3 extends in the second direction DR2 and is connected to the second reference voltage line 174-2 through the opening OP2, the second reference voltage line 174-2 is connected to the fifth semiconductor 1135 through the opening OP1, and the reference voltage Vref is also transferred to the first reference voltage line 174-1 extending from the fifth semiconductor 1135. According to this structure, the reference voltage Vref is transferred in the second direction through the third reference voltage line 174-3, and is also transferred in the first direction through the second reference voltage line 174-2 and the first reference voltage line 174-1. Due to the reference voltage line having such a mesh structure, the reference voltage Vref may have a constant voltage value throughout the emissive display device.

The fifth connecting layer SD21 is connected to the fourth connecting layer SD14 through the opening OP2, and is connected to the second electrode of the sixth transistor T6 and the second electrode of the seventh transistor T7 through the opening OP1. The fifth connecting layer SD21 is connected to an anode of the light emitting diode LED through an opening OP3 (see FIG. 10), to connect the second electrode of the sixth transistor T6 and the second electrode of the seventh transistor T7 to the anode.

The second data conductive layer may additionally include a vertical first-1 initialization voltage line 173-1, and is connected to the first initialization voltage line 173 through the opening OP2 so that the first initialization voltage Vint is applied in the first and second directions DR1 and DR2. The vertical first-1 initialization voltage line 173-1 may be changed to a vertical second initialization voltage line transferring the second initialization voltage Vaint in the second direction (vertical direction) or a driving low-voltage line transferring the drive low-voltage ELVSS in the second direction (vertical direction) depending on a position thereof. Each wire may be connected to a wire to which the same voltage is applied through the opening OP2.

A second data conductive layer may include a metal such as aluminum (Al), copper (Cu), molybdenum (Mo), titanium (T1), or a metal alloy thereof, and may be a single layer or a multi-layer.

In the above embodiment, it can be seen that the voltage lines for transferring various voltages have a structure in which they are connected to each other while being formed in conductive layers. Such a structure includes a configuration in which a same voltage is transferred to a mesh structure or to layers so as to lower resistance so that a voltage drop is less and a voltage difference is less depending on the position of the pixel. Unlike in the above embodiments, other voltage lines may also have a mesh structure or be formed in conductive layers.

Referring to FIG. 11, a second organic layer 145 may be positioned on the second data conductive layer. The second organic layer 145 may be an organic insulator, and may include at least one material of a polyimide, a polyamide, an acryl resin, benzo cyclobutene, and a phenol resin.

Figure 10:
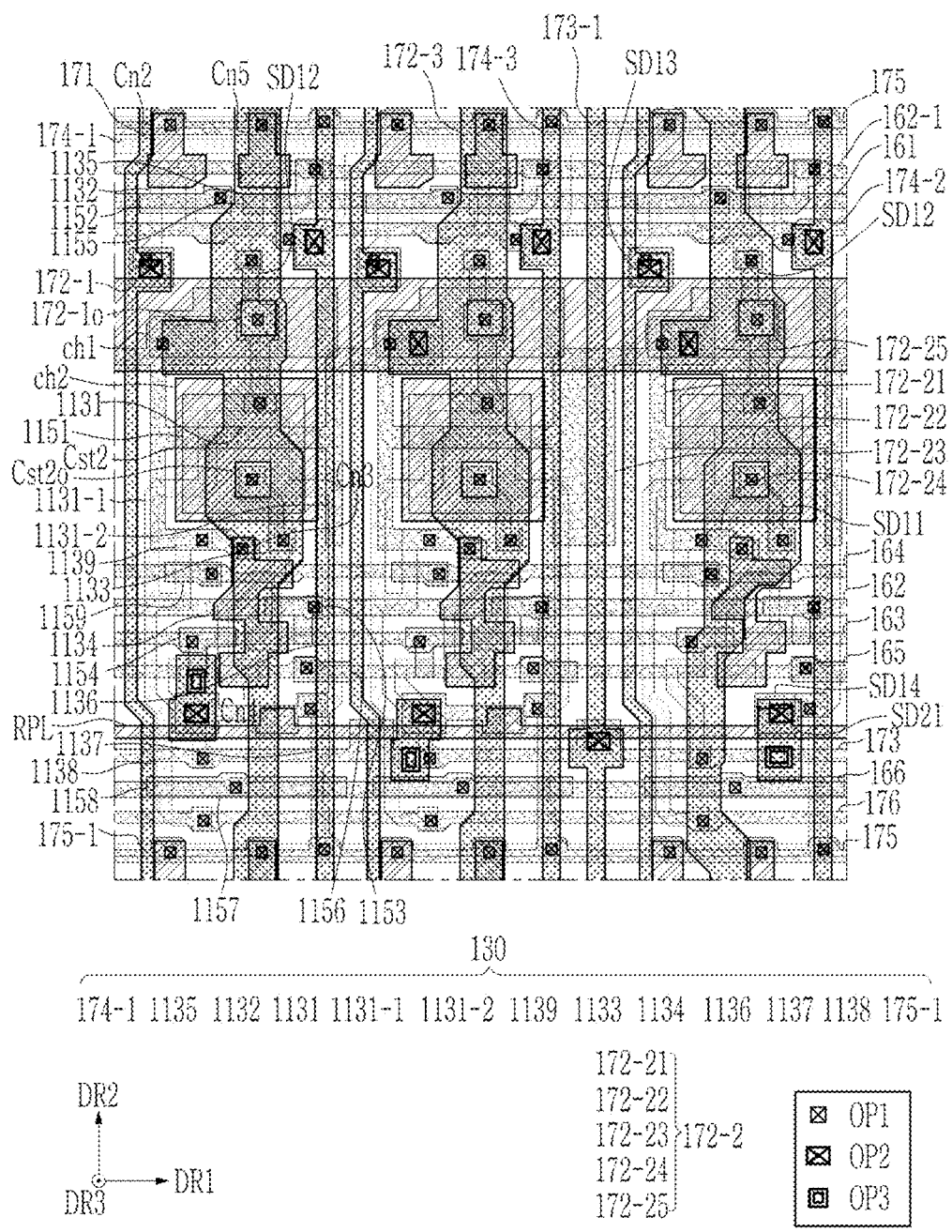

Referring to FIG. 10, an opening OP3 is formed in the second organic layer 145, through which the anode of the light emitting diode LED positioned on the second organic layer 145 is connected to the fifth connecting layer SD21 positioned on the second data conductive layer. As a result, the second electrode of the sixth transistor T6 and the second electrode of the seventh transistor T7 may be connected to the anode, and an output current of the driving transistor T1 may be transferred to the anode of the light emitting diode LED through the sixth transistor T6.

Although not illustrated, a structure of an upper portion of the second organic layer 145 may be briefly described as follows.

A light emitting diode LED constituting a pixel may be positioned at an upper portion of the second organic layer 145. An anode is positioned on the second organic layer 145, and a pixel defining layer having an opening overlapping the anode is positioned. The pixel defining layer may overlap a portion of the anode, and a remaining portion of the anode may be exposed through an opening. A spacer may be positioned above the pixel defining layer.

An emission layer is disposed in the opening of the pixel defining layer and on the anode, and a cathode is positioned on the pixel defining layer and the emission layer. The emission layer may be formed of an organic light emitting material, and adjacent emission layers may display different colors. According to an embodiment, a color filter or a color conversion layer may be additionally formed to display colors.

An encapsulation layer or an encapsulation substrate may be positioned on the cathode to protect the emission layer formed of an organic material from moisture or oxygen that may be introduced from the outside. The encapsulation layer may include an inorganic layer and an organic layer, and may include a triple-layer structure of an inorganic layer, an organic layer, and an inorganic layer.

According to an embodiment, a sensing electrode may be further positioned on the encapsulation layer to enable touch sensing. According to an embodiment, a polarizer may be positioned at an outermost side of the emission display device. The polarizer may serve to prevent deterioration in display quality in case that a user recognizes incident light from external light as it is reflected from an anode, a cathode, a sensing electrode, and the like within the spirit and the scope of the disclosure.

In the above, a planar structure of a pixel circuit unit of a pixel of an emissive display device according to an embodiment has been examined in detail.

Hereinafter, a connection relationship between the gate electrode 1151, the storage capacitor Cst, and the hold capacitor Chold of the driving transistor T1 will be described based on the connection relationship of the D-node of FIG. 1 with reference to FIG. 11.

FIG. 11 illustrates a partial schematic cross-sectional view of an emissive display device according to an embodiment.

Referring to FIG. 11, a schematic cross-section of the entire light emitting display panel is as follows.

The semiconductor layer 130 including the first semiconductor 1131 of the driving transistor T1 is positioned on the substrate 110. The semiconductor layer 130 includes a channel region, and a first region and a second region positioned at opposite sides of the channel region.

The substrate 110 and the semiconductor layer 130 are covered with the first gate insulating layer 141. According to an embodiment, the first gate insulating layer 141 may be disposed only on the semiconductor layer 130.

A first gate conductive layer including the gate electrode 1151 of the driving transistor T1 and the first electrode ch1 of the hold capacitor Chold is disposed on the first gate insulating layer 141. A region of the semiconductor layer 130 overlapping the gate electrode in a plan view may be a channel region, and the channel region of the driving transistor T1 may overlap the gate electrode 1151 of the driving transistor T1.

The first gate conductive layer is covered with the second gate insulating layer 142, and a second gate conductive layer including the second electrode Cst2 of the storage capacitor Cst and the first driving voltage line 172-1 is disposed on the second gate insulating layer 142.

The second electrode Cst2 of the storage capacitor Cst overlaps the gate electrode 1151 of the driving transistor T1 to form the storage capacitor Cst, and the first driving voltage line 172-1 overlaps the first electrode ch1 of the hold capacitor Chold to form the hold capacitor Chold.

The first driving voltage line 172-1 has an opening 172-10 so that the second data conductive layer (the second connecting layer SD12) to be described later may be connected to the first electrode ch1 of the hold capacitor Chold.

The second gate conductive layer is covered by the first interlayer insulating layer 143, and the first data conductive layer including the second driving voltage line 172-2 and the second connecting layer SD12 is disposed on the first interlayer insulating layer 143.

A first end of the second connecting layer SD12 is connected to the first electrode ch1 of the hold capacitor Chold through the opening OP1 formed in the opening 172-10 of the first driving voltage line 172-1, and the first interlayer insulating film 143 and the second gate insulating film 142. A second end of the second connecting layer SD12 is connected to the second electrode Cst2 of the storage capacitor Cst through the opening OP1 formed in the first interlayer insulating layer 143. Although not illustrated in FIG. 11, the second connecting layer SD12 extends further and is connected to the second semiconductor 1132 and the fifth semiconductor 1135 positioned on the semiconductor layer 130 through the opening OP1. All portions connected by the second connecting layer SD12 correspond to the D-node of FIG. 1, and the D-nodes are respectively positioned on the semiconductor layer 130, the first gate conductive layer, and the second gate conductive layer to connect them with the second connecting layer SD12 positioned in the first data conductive layer.

The first data conductive layer is covered by the first organic layer 144, and the second data conductive layer including the third driving voltage line 172-3 is disposed on the first organic layer 144. Although not illustrated in FIG. 11, in the first organic layer 144, referring to FIG. 8, the opening OP2 may be positioned to connect the second data conductive layer and the first data conductive layer.

The second data conductive layer is covered by the second organic layer 145, and although the second organic layer 145 is not illustrated in FIG. 11, referring to FIG. 10, the opening OP3 may be positioned to connect the anode and the second data conductive layer. A light emitting diode LED including an anode, an emission layer, and a cathode may be positioned on the second organic layer 145.

Referring to FIG. 11, the gate electrode 1151 of the driving transistor T1 serves two roles of constituting the first semiconductor 1131 and the driving transistor T1 positioned below the substrate 110, and constituting the storage capacitor Cst while overlapping the second electrode Cst2 of the storage capacitor Cst positioned at an upper side in a direction away from the substrate 110.

The hold capacitor Chold is formed by overlapping the first electrode ch1 of the hold capacitor Chold positioned on the first gate conductive layer and the first driving voltage line 172-1 positioned on the second gate conductive layer. Among them, the first electrode ch1 of the hold capacitor Chold is connected to the second electrode Cst2 of the storage capacitor Cst through the second connecting layer SD12.

As described above, in case that the overall capacitance is increased by using the two capacitors Cst and Chold, a voltage of the gate electrode 1151 of the driving transistor T1 may be maintained, and as a result, it is possible to reduce a luminance difference that may occur in a high gray during low-frequency driving, and in case that driving at a high frequency, crosstalk may be removed or power consumption may be reduced, thereby improving display quality of the emissive display device.

In the above, a structure of a display pixel according to an embodiment has been described. Hereinafter, a repair pixel capable of repairing a defect in one of the display pixels will be described in detail.

First, an overall structure of the emissive display device will be described with reference to FIG. 12.

Figure 12:
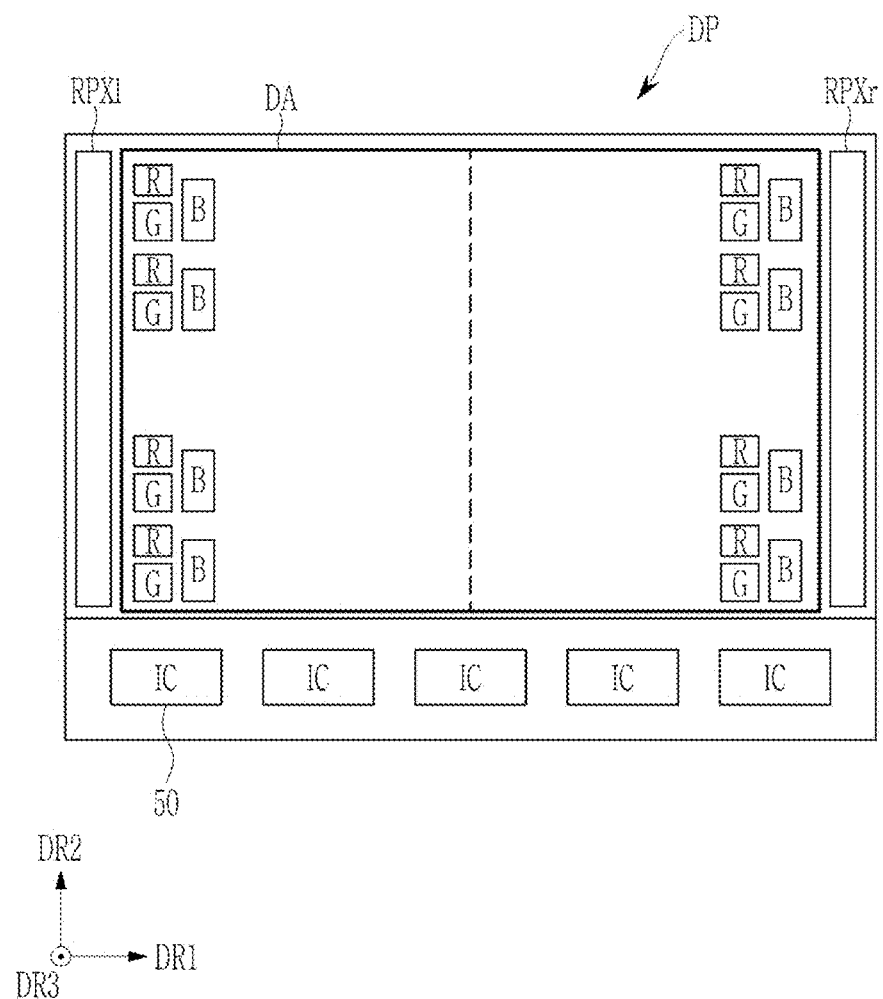
FIG. 12 illustrates a schematic top plan view of an emissive display device according to an embodiment.

FIG. 12 illustrates a schematic top plan view of an emissive display device according to an embodiment.

The emissive display device DP according to an embodiment may include a display area DA, a first repair pixel area RPX1 and a second repair pixel area RPXr positioned at opposite sides of the display area DA in the first direction DR1, and driving chips 50 (IC) outside the display area DA.

A disposition of the display pixels R, G, and B illustrated in the display area DA in FIG. 12 may indicate a disposition of light emitting diodes included in the display pixels. The disposition and number of light emitting diodes arranged or disposed in the display area DA may vary according to embodiments.

The first repair pixel area RPX1 and the second repair pixel area RPXr are positioned at opposite sides of the display area DA in the first direction DR1, the first repair pixel area RPX1 is positioned at a left side of the display area DA, and the second repair pixel area RPXr is positioned at a right side of the display area DA. A same number of repair pixels as a number of rows of display pixels formed in the display area DA may be formed in each of the first repair pixel area RPX1 and the second repair pixel area RPXr.

A dotted line extending in the second direction DR2 is illustrated at a center of the display area DA of FIG. 12. In case that a "defective pixel" occurs in display pixels R, G, and B positioned at a left side of the dotted line, repair is performed using the first repair pixel area RPX1 positioned at the left side, and in case that a "defective pixel" occurs in the display pixels R, G, and B positioned at a right side of the dotted line, repair may be performed using the second repair pixel area RPXr positioned the right side.

The emissive display device DP is driven by driving chips 50 (IC), and although five driving chips 50 (IC) are illustrated in FIG. 12, it may include only one driving chip 50 (IC) according to an embodiment.

Although not illustrated in FIG. 12, a scan driver generating a scan signal or an emission signal may be further included outside the first repair pixel area RPX1 and the second repair pixel area RPXr.

According to an embodiment, only one of the first repair pixel area RPX1 and the second repair pixel area RPXr may be included.

In the above, the schematic disposition of the emissive display device has been described through FIG. 12.

Hereinafter, a circuit structure of one repair pixel included in the first repair pixel area RPX1 and the second repair pixel area RPXr will be described through FIG. 13.

Figure 13:
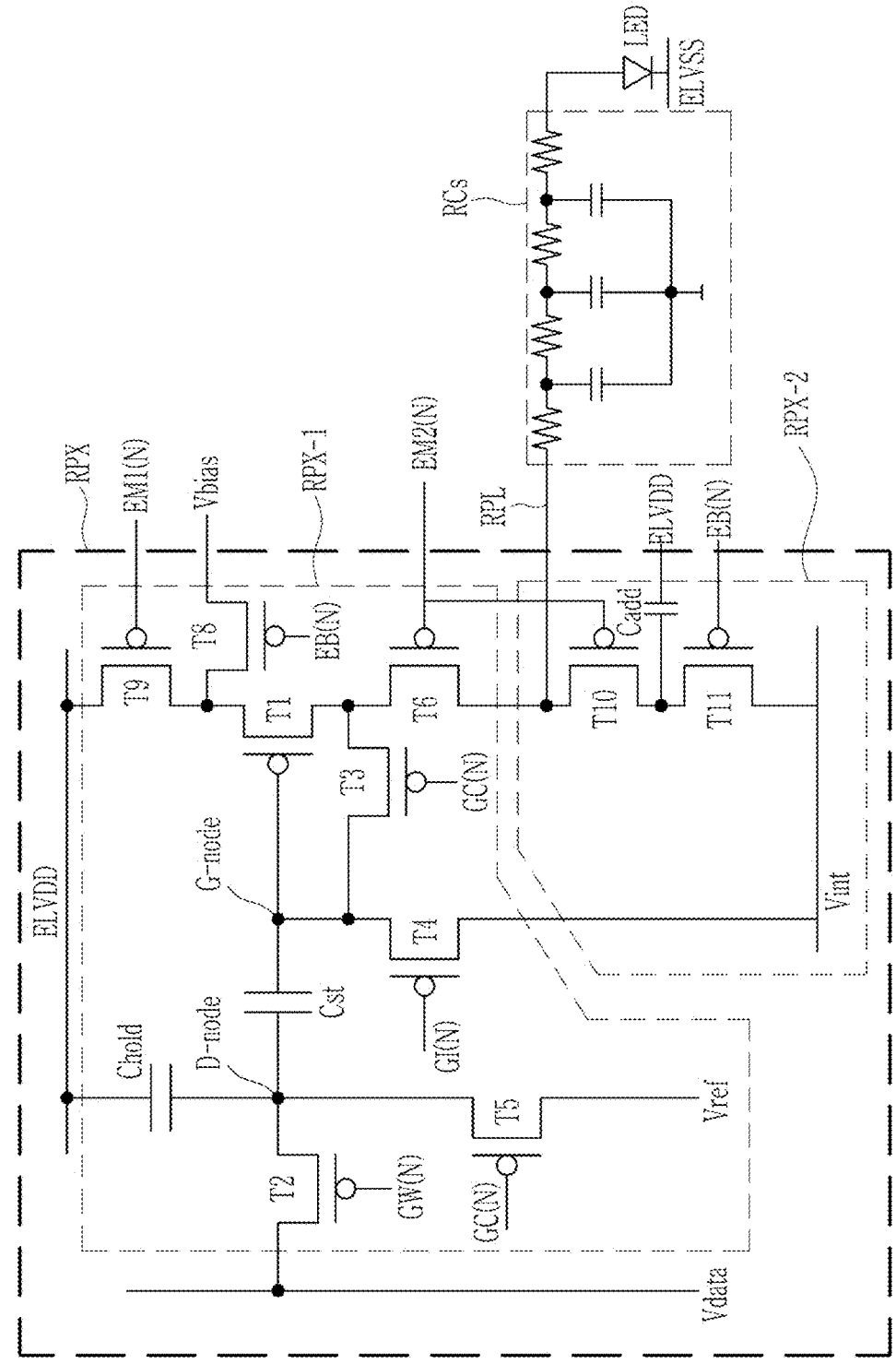
FIG. 13 illustrates a schematic diagram of an equivalent circuit a of a repair pixel included in an emissive display device according to an embodiment.

FIG. 13 illustrates a schematic diagram of an equivalent circuit of a repair pixel included in an emissive display device according to an embodiment.

In the schematic circuit diagram of FIG. 13, in addition to a circuit diagram of a repair pixel, a schematic diagram of an equivalent circuit diagram connected to a defective pixel is illustrated.

In FIG. 13, the repair pixel RPX is divided into two parts. The first repair pixel unit RPX-1 has a same circuit structure as that of the display pixel of FIG. 1, and the second repair pixel unit RPX-2 has a circuit structure that is different from that of the display pixel of FIG. 1. The repair pixel RPX does not include a light emitting diode LED, and a current may be transferred to the light emitting diode LED of a defective display pixel.

The first repair pixel unit RPX-1 may have the same circuit structure as that of the first pixel circuit unit in FIG. 1 including all components other than the light emitting diode LED and the seventh transistor T7.

The repair pixel RPX does not include a light emitting diode LED because a current must be transferred to the light emitting diode LED of the defective pixel, and the seventh transistor T7 for initializing the anode of the light emitting diode LED is not included. Accordingly, the repair pixel RPX does not include the light emitting diode LED and the seventh transistor T7.

Since the circuit structure of the first repair pixel unit RPX-1 is the same as that of the first pixel circuit unit of the display pixel of FIG. 1, a description thereof may be omitted. The second pixel circuit unit of the display pixel may not be included in the repair pixel RPX. Herein, the first pixel circuit unit in FIG. 1 may include a driving transistor T1, a second transistor T2, a third transistor T3, a fourth transistor T4, a fifth transistor T5, a sixth transistor T6, an eighth transistor T8, a ninth transistor T9, a storage capacitor Cst, and a hold capacitor Chold, and the second pixel circuit unit may include the light emitting diode LED and the seventh transistor T7.

The repair pixel RPX of the display pixel may further include a second repair pixel unit RPX-2, and the second repair pixel unit RPX-2 may include a tenth transistor T10, an eleventh transistor T11, and an additional capacitor Cadd.

Capacitance magnitudes of the storage capacitor Cst and the hold capacitor Chold included in the display pixel may be different from capacitance magnitudes of the storage capacitor Cst and the hold capacitor Chold included in the repair pixel RPX. A capacitance magnitude of the additional capacitor Cadd may be different from a capacitance magnitude of the storage capacitor Cst and the hold capacitor Chold included in the display pixel.

A size of a transistor included in the first pixel circuit unit included in the display pixel may be the same as that of the transistor included in the first repair pixel unit RPX-1. Sizes of the tenth transistor T10 and the eleventh transistor T11 included in the second repair pixel unit RPX-2 may be the same as that of one transistor included in the first pixel circuit unit.

According to an embodiment, the display pixel and the repair pixel RPX may include transistors and capacitors having different sizes from those as described above, and capacitance magnitudes of the storage capacitor Cst and the hold capacitor Chold included in the display pixel may be the same as those of the storage capacitor Cst and the hold capacitor Chold included in the repair pixel RPX.

A detailed structure of the second repair pixel unit RPX-2 will be described as follows.

The tenth transistor T10 (hereinafter also referred to as a repair output terminal transistor) includes a gate electrode connected to a second emission signal line to which a second emission control signal EM2(N) is applied, a first electrode (input-side electrode) connected to the second electrode of the sixth transistor T6, and a second electrode (output-side electrode) connected to the second electrode of the eleventh transistor T11 and the first electrode of the additional capacitor Cadd. Herein, the second electrode of the sixth transistor T6 and the first electrode of the tenth transistor T10 are connected to the repair line RPL, and may be connected to the light emitting diode LED of the defective display pixel. In case that the tenth transistor T10 outputs an output current of the driving transistor T1 to the repair line RPL based on the second emission control signal EM2(N), an output terminal of the repair pixel RPX may be connected to the additional capacitor Cadd so that a voltage at the output terminal of the repair pixel RPX may be constant.

The second transistor T11 (hereafter also referred to as an additional capacitor initialization transistor) may include a gate electrode 1157 connected to a fourth scan line to which the fourth scan signal EB(N) is applied, a first electrode receiving a first initialization voltage Vint, and a second electrode connected to the second electrode of the tenth transistor T10 and the first electrode of the additional capacitor Cadd. The eleventh transistor T11 serves to initialize the first electrode of the additional capacitor Cadd to the first initialization voltage Vint.

According to an embodiment, the second electrode of the eleventh transistor T11 may receive the second initialization voltage Vaint, to transfer it to the first electrode of the additional capacitor Cadd like the seventh transistor T7. In this embodiment, there is a difference in that the repair pixel RPX does not include only the light emitting diode LED, and the eleventh transistor T11 corresponding to the seventh transistor T7 is connected to the additional capacitor Cadd. The repair pixel RPX may further include a tenth transistor T10 and an additional capacitor Cadd.

The additional capacitor Cadd (hereinafter referred to as a repair output terminal capacitor) includes a first electrode connected to the second electrode of the tenth transistor T10 and the second electrode of the eleventh transistor T11, and a second electrode receiving the driving voltage ELVDD. According to the additional capacitor Cadd, a voltage at an output terminal of the repair pixel RPX may be constant even in case that a peripheral signal fluctuates.

A current output from the driving transistor T1 included in the repair pixel RPX is outputted to the repair line RPL through the sixth transistor T6, and is transferred to the light emitting diode LED of the defective display pixel. Capacitance generated by overlapping transistors, electrodes, and/or capacitors from the repair line RPL to a defective display pixel and resistance generated from the repair line RPL may cause an RC delay, and in FIG. 13, a structure that causes an RC delay is illustrated by converting an equivalent circuit into an RC delay unit (RCs).

A planar structure according to an embodiment of the repair pixel RPX having the circuit structure as described above will be described through FIG. 14 to FIG. 21.

FIG. 14 to FIG. 21 each illustrate a schematic top plan view of each layer depending on a manufacturing order of a repair pixel according to an embodiment.

Referring to FIG. 14 to FIG. 21, one repair pixel RPX in the first repair pixel area RPX1 positioned at a left side of the display area DA is illustrated. The repair pixel RPX may occupy a larger area than the display pixel, and may have an area that is larger than the display pixel by an area occupied by the additional capacitor Cadd in the repair pixel RPX.

Hereinafter, in each step of forming the repair pixel RPX, it may be simultaneously formed of the same material or a similar material as in each step of the display area described with reference to FIG. 3 to FIG. 11. Hereinafter, differences between the pixel structure of the display area illustrated in FIG. 3 to FIG. 10 and the pixel structure of the repair pixel RPX illustrated in FIG. 14 to FIG. 21 will be described. Portions where the pixel structure of the display area and the pixel structure of the repair pixel RPX are the same may be the same as those described with reference to FIG. 3 to FIG. 10.

Figure 14:
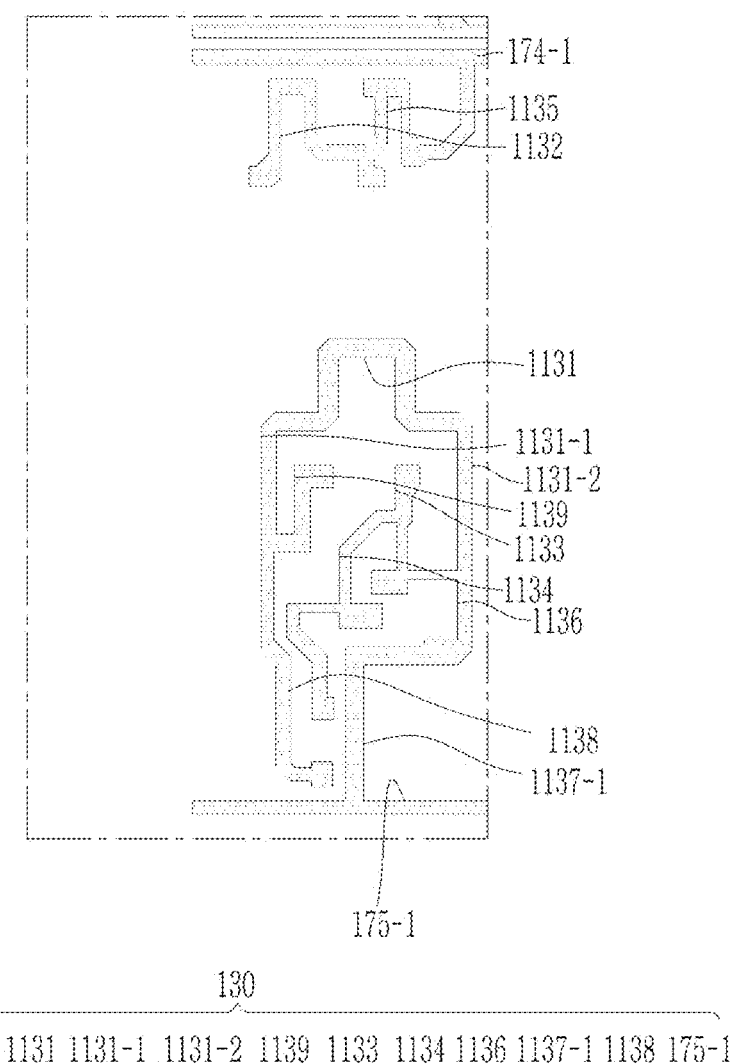
FIG. 14 to FIG. 21 each illustrate a schematic top plan view of each layer depending on a manufacturing order of a repair pixel according to an embodiment.

First, referring to FIG. 14, a semiconductor layer 130 is disposed on a substrate 110 (see FIG. 11).

Unlike in the semiconductor layer 130 of the display pixel illustrated in FIG. 3, the semiconductor layer 130 of the repair pixel RPX illustrated in FIG. 14 does not include the seventh semiconductor 1137, but instead includes the repair pixel semiconductor 1137-1.

In the semiconductor layer 130 of the display pixel illustrated in FIG. 3, the sixth semiconductor 1136 and the second-1 initialization voltage line 175-1 are connected to the seventh semiconductor 1137 extending in the second direction DR2. However, the semiconductor layer 130 of the repair pixel RPX illustrated in FIG. 14 includes a repair pixel semiconductor 1137-1 extending from the sixth semiconductor 1136 in the first direction DR1 and bent in the second direction DR2 instead of the seventh semiconductor 1137, and is connected to the second-1 initialization voltage line 175-1 by the repair pixel semiconductor 1137-1. Herein, a channel of the tenth transistor T10 may be positioned in a portion extending in the first direction DR1 from the repair pixel semiconductor 1137-1, and a channel of the eleventh transistor T11 may be positioned in a portion extending in the second direction DR2.

Figure 15:
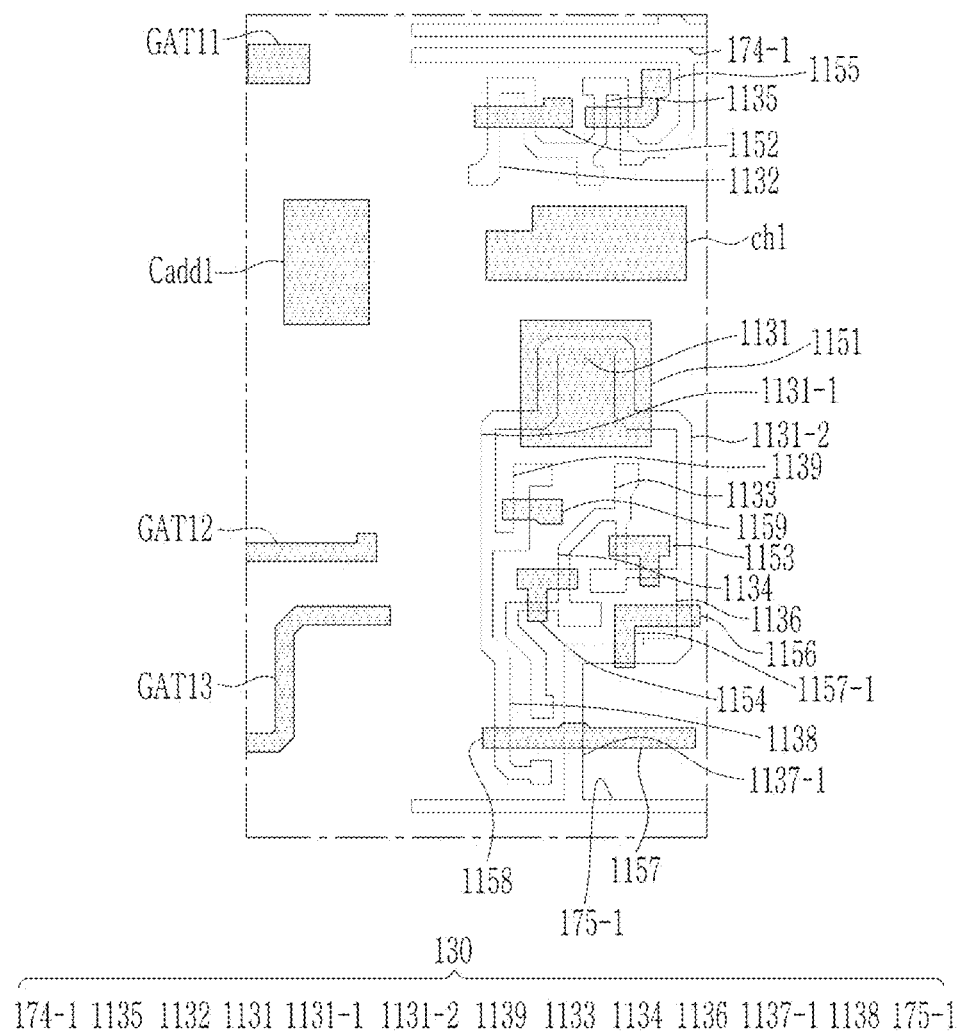

Referring to FIG. 11, the first gate insulating layer 141 may be disposed on the semiconductor layer 130, and the first gate conductive layer including the gate electrode 1151 of the driving transistor T1 may be disposed on the first gate insulating layer 141 as illustrated in FIG. 15. The gate electrode 1151 of the driving transistor T1 may correspond to one of the G-nodes.

Unlike in the first gate conductive layer of the display pixel illustrated in FIG. 4, the first gate conductive layer of the repair pixel RPX illustrated in FIG. 15 may further include a first electrode of the additional capacitor Cadd1, a tenth gate electrode 1157-1 of the tenth transistor T10, and multiple signal line connectors GAT11, GAT12, and GAT13.

The first electrode Cadd1 of the additional capacitor may be formed at a position away from the first electrode ch1 of the hold capacitor Chold in the first direction DR1, and a portion where the first electrode Cadd1 of the additional capacitor is positioned may be positioned outside a region corresponding to the display pixel, to have an area that is larger than that of the display pixel by an area where the additional capacitor Cadd is formed in the repair pixel RPX.

In the tenth gate electrode 1157-1 of the tenth transistor T10, the sixth transistor T6 extends from the sixth gate electrode 1156 in the first direction DR1 and bends in the second direction DR2 to overlap a portion of the repair pixel semiconductor 1137-1. In the tenth gate electrode 1157-1 of the tenth transistor T10, the sixth transistor T6 may be integral with the sixth gate electrode 1156.

The signal line connectors GAT11, GAT12, and GAT13 may be further included outside the region corresponding to the display pixel. Herein, the signal line connectors GAT11, GAT12, and GAT13 are wires for a scan line or emission signal line formed in a display pixel to a scan driver that generates a scan signal or emission control signal.

In FIG. 15, each of the second scan lines 162-1 and 162 to which the second scan signal GC(N) is applied and the second emission signal line 165 to which the second emission control signal EM2(N) is applied may be connected to a scan driver through each of the signal line connectors GAT11, GAT12, and GAT13 of the first gate conductive layer.

Even in the repair pixel RPX, after forming the first gate conductive layer, a plasma treatment or doping process may be performed to make a portion of the semiconductor layer 130 that is not covered with the first gate conductive layer 130 conductive. For example, the semiconductor layer 130 covered by the first gate conductive layer may not be conductive, and a portion of the semiconductor layer 130 not covered by the first gate conductive layer may have a same characteristic as that of the conductive layer. As a result, repair pixel semiconductors 1137-1 not covered by the tenth gate electrode 1157-1 may be conductive, and a channel of the tenth transistor T10 may be positioned in a portion of the repair pixel semiconductor 1137-1 overlapping the tenth gate electrode 1157-1.

Figure 16:
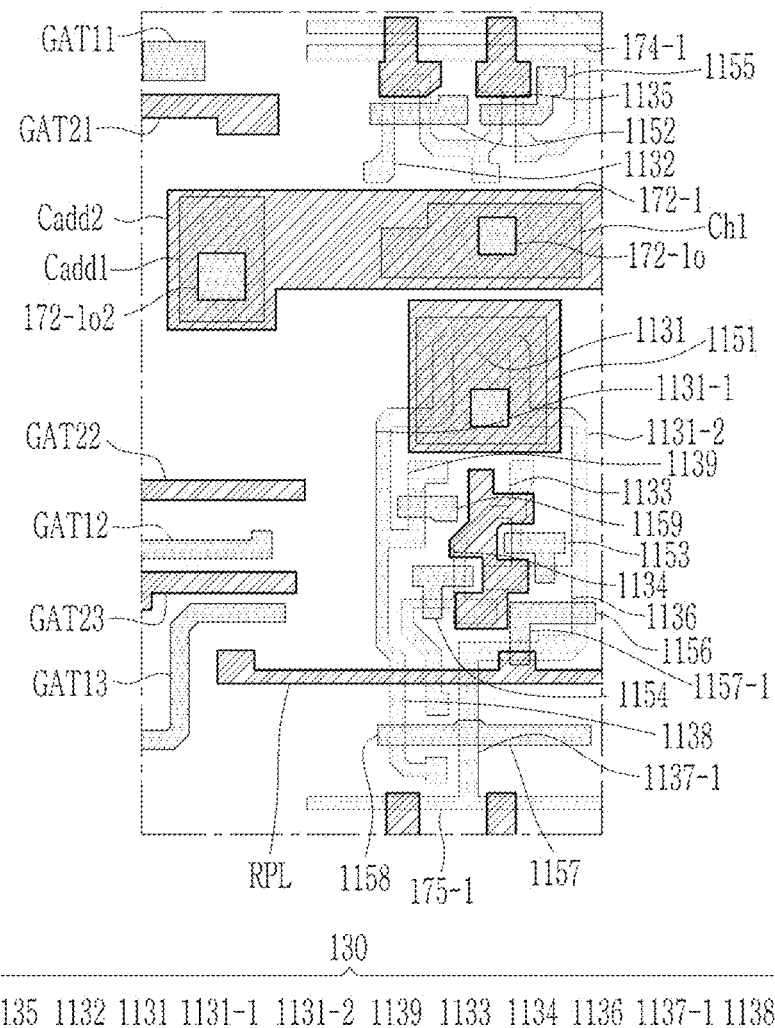
Figure 16:
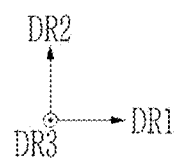

Referring to FIG. 11, the second gate insulating layer 142 may be positioned on the first gate conductive layer and the first gate insulating layer 141, and a second gate conductive layer may be disposed on the second gate insulating layer 142 as illustrated in FIG. 16.

Unlike in the second gate conductive layer of the display pixel illustrated in FIG. 5, the first gate conductive layer of the repair pixel RPX illustrated in FIG. 16 may further include a second electrode of the additional capacitor Cadd2, and multiple signal line connectors GAT21, GAT22, and GAT23.

The second electrode Cadd2 of the additional capacitor, which is a portion where the first driving voltage line 172-1 further extends in the first direction DR1, is a portion to which the driving voltage ELVDD is transferred. A width of the second electrode Cadd2 of the additional capacitor in the second direction DR2 may be greater than a width of the first driving voltage line 172-1 in the second direction DR2. The second electrode Cadd2 of the additional capacitor includes an opening 172-1$o$2 overlapping a portion of the first electrode Cadd1 of the additional capacitor. The second gate insulating layer 142 positioned between cross-sections of the second electrode Cadd2 and the first electrode Cadd1 of the additional capacitor each also have an opening (see FIG. 17) corresponding to the opening 172-1$o$2 so that the first electrode Cadd1 of the additional capacitor is exposed upward and is formed to be connected to the upper conductive layer. The second electrode Cadd2 of the additional capacitor overlapping the first electrode Cadd1 of the additional capacitor and the second gate insulating layer 142 positioned therebetween constitute the additional capacitor Cadd of FIG. 13.

The signal line connectors GAT21, GAT22, and GAT23 of the second gate conductive layer may also be positioned outside the region corresponding to the display pixel. Herein, the signal line connectors GAT21, GAT22, and GAT23 are wires for a scan line or emission signal line formed in a display pixel to a scan driver that generates a scan signal or emission control signal.

In FIG. 16, each of the first scan line 161 to which the first scan signal GW(N) is applied, the third scan line 163 to which the third scan signal GI(N) is applied, and the first light emitting signal lines 164 to which the first light emitting control signal EM1(N) is applied may be connected to a scan driver through each of the signal line connection portions GAT21, GAT23, and GAT22 of the second gate conductive layer.

In FIG. 16, the repair line RPL positioned on the second gate conductive layer may extend from the display pixel to the repair pixel RPX, and extend from the repair pixel RPX to the outside of the region corresponding to the display pixel, and may have an extension at an end. The expanding portion is also positioned in a region corresponding to each display pixel in the repair line RPL. The expanding portion positioned on the repair line RPL may correspond to a position where it is short-circuited with a laser (refer to Short in FIG. 21) to repair a defective display pixel. The position where it is short-circuited with the laser (refer to Short in FIG. 21) may be an expanding portion of the repair line RPL positioned in a defective display pixel and an expanding portion of the repair line RPL positioned in the repair pixel RPX. According to an embodiment, the expanding portion positioned at an end of the repair line RPL may also be short-circuited with a laser (see Short in FIG. 21). As a result, a current of the driving transistor T1 of the repair pixel RPX is transferred to the light emitting diode LED of the defective display pixel through the repair line RPL.

Figure 17:
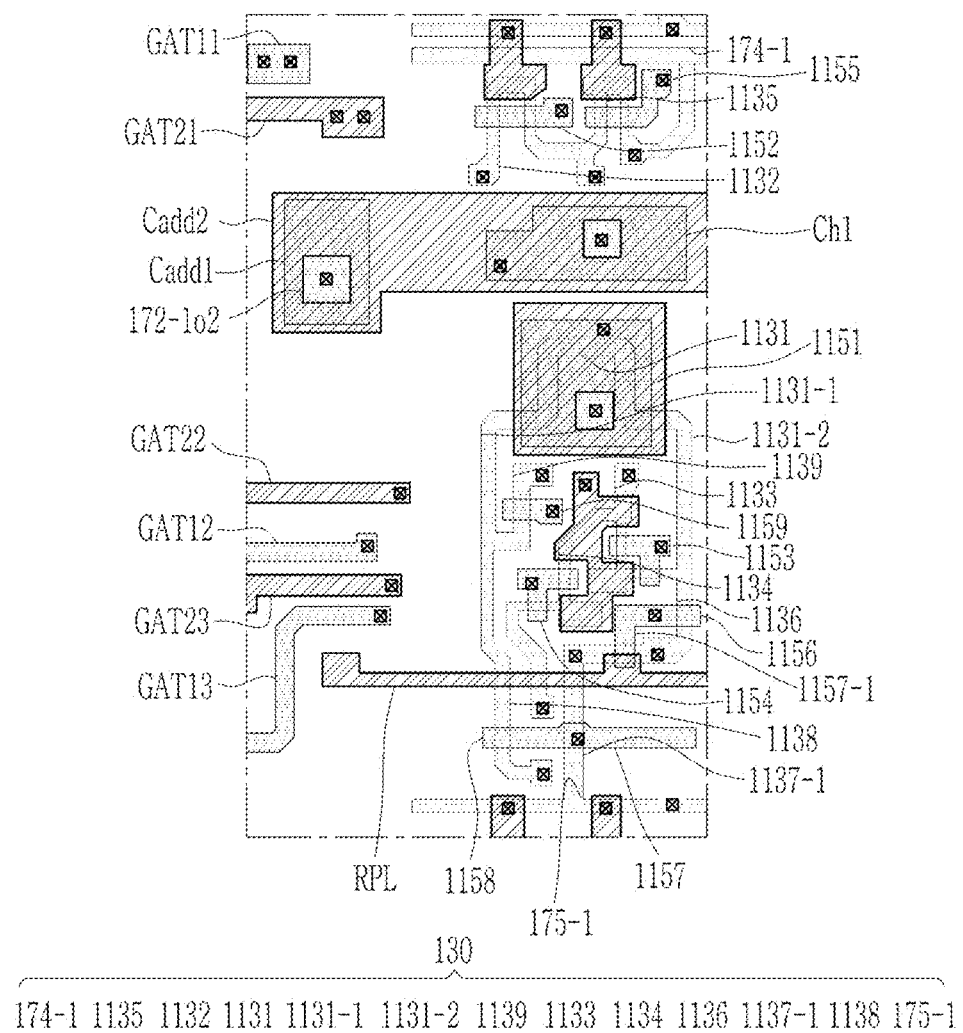

Referring to FIG. 11, the first interlayer insulating layer 143 is positioned on the second gate conductive layer, and the opening OP1 is formed in an insulating layer such as the first interlayer insulating layer 143 as shown in FIG. 17.

The opening OP1 illustrated in FIG. 17 may further include the opening OP1 illustrated in FIG. 6 and a following portion.

An opening OP1 additionally exposing the repair pixel semiconductor 1137-1 is formed in a region corresponding to the display pixel. The opening OP1 may be positioned at a portion that extends in the first direction DR1 and is bent in the second direction DR2 in the repair pixel semiconductor 1137-1. The opening OP1 may allow the repair pixel semiconductor 1137-1 to be connected to an end of a connection line (refer to RPL-c in FIG. 18) formed in a subsequent process.

Openings OP1 exposing the signal line connectors GAT11, GAT12, and GAT13 of the first gate conductive layer and signal line connection portions GAT21, GAT22, and GAT23 of the second gate conductive layer are also formed outside of the region corresponding to the display pixel. The opening OP1 may expose each of the signal line connectors to connect them to the second scan lines 162 and 162-1, the second emission signal line 165, the first scan line 161, the third scan line 163, and the first emission signal line 164 formed in a subsequent process.

The opening OP1 exposing the signal line connectors GAT11, GAT12, and GAT13 of the first gate conductive layer may be integral with on the first interlayer insulating layer 143 and the second gate insulating layer 142 to expose the first gate conductive layer.

The opening OP1 exposing the signal line connectors GAT21, GAT22, and GAT23 of the second gate conductive layer is positioned on the first interlayer insulating layer 143 to expose the second gate conductive layer.

The opening OP1 exposing the first gate conductive layer also overlaps the opening 172-1$o$2 positioned on the second electrode Cadd2 of the additional capacitor in the second gate conductive layer to expose the lower first gate conductive layer, for example, the first electrode Cadd1 of the additional capacitor.

Figure 18:
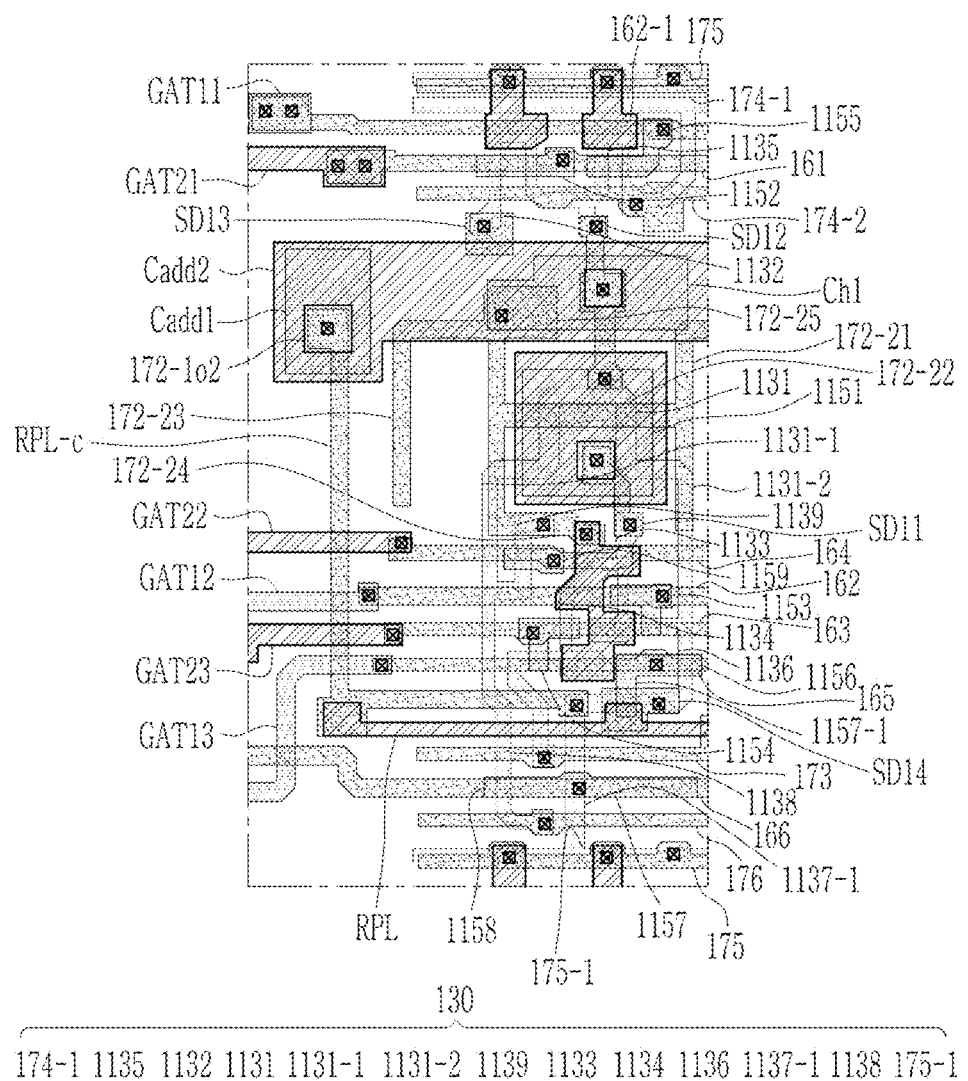
Figure 18:
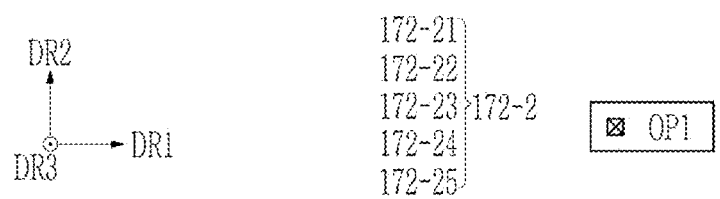

Referring to FIG. 18, a first data conductive layer may be disposed on the first interlayer insulating layer 143.

Unlike in the first data conductive layer illustrated in FIG. 7, the first data conductive layer illustrated in FIG. 18 may further include a connection line RPL-c.

The connection line RPL-c is positioned outside the region corresponding to the display pixel, and may extend to the region corresponding to the display pixel. The connection line RPL-c may be connected to the repair pixel semiconductor 1137-1 through the opening OP1 in the region corresponding to the display pixel, and a portion where the connection line RPL-c and the repair pixel semiconductor 1137-1 are connected may be a portion where the repair pixel semiconductor 1137-1 extends in the first direction DR1 and bends in the second direction DR2.

The connection line RPL-c extends in the second direction DR2 outside the region corresponding to the display pixel in the second direction DR2 and includes the opening 172-1$o$2 positioned on the opening OP1 and the second electrode Cadd2 of the additional capacitor, and is connected to the first electrode Cadd1 of the additional capacitor through the opening 172-1o2.

Signal lines through which a signal (a scan signal and an emission signal) that changes every frame can be inputted may be extended outside the region corresponding to the display pixel, and among them, the fourth scan line 166 to which the fourth scan signal EB(N) is applied may have a structure that continuously extends in the first direction DR1 to be connected to the scan driver.

The second scan lines 162 and 162-1, the second light emitting signal line 165, the first scan line 161, the third scan line 163, and the first light emitting signal line 164 may be connected to the signal line connectors GAT11, GAT12, and GAT13 of the first gate conductive layer or the signal line connectors GAT21, GAT22, and GAT23 of the second gate conductive layer outside the region corresponding to the display pixel through the opening OP1 to be connected to the scan driver.

The region corresponding to the display pixel and an outside thereof may be divided by a shielding portion 172-23 positioned in the first data conductive layer. The shielding portion 172-23 extends in the second direction DR2, and is positioned outside the region corresponding to the display pixel. As a result, a portion positioned at a right side of the shielding portion 172-23 is the region corresponding to the display pixel in the repair pixels RPX, and a remaining portion may be outside the region corresponding to the display pixel.

Figure 19:
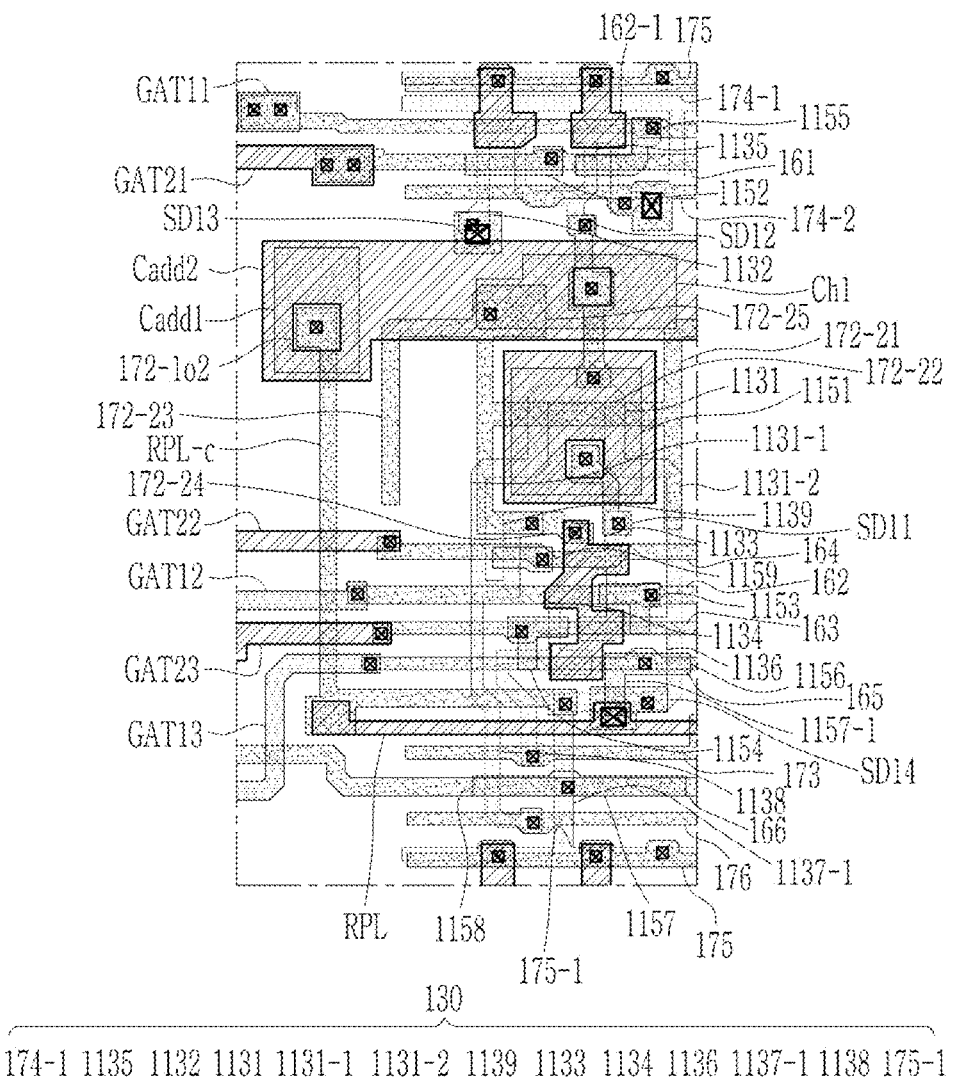

Referring to FIG. 11, the first organic layer 144 may be disposed on the first data conductive layer, and as illustrated in FIG. 19, the opening OP2 is positioned in the first organic layer 144. The opening OP2 exposes the first data conductive layer and is connected to the second data conductive layer.

The opening OP2 illustrated in FIG. 19 may not be different from the opening OP2 illustrated in FIG. 8.

Figure 20:
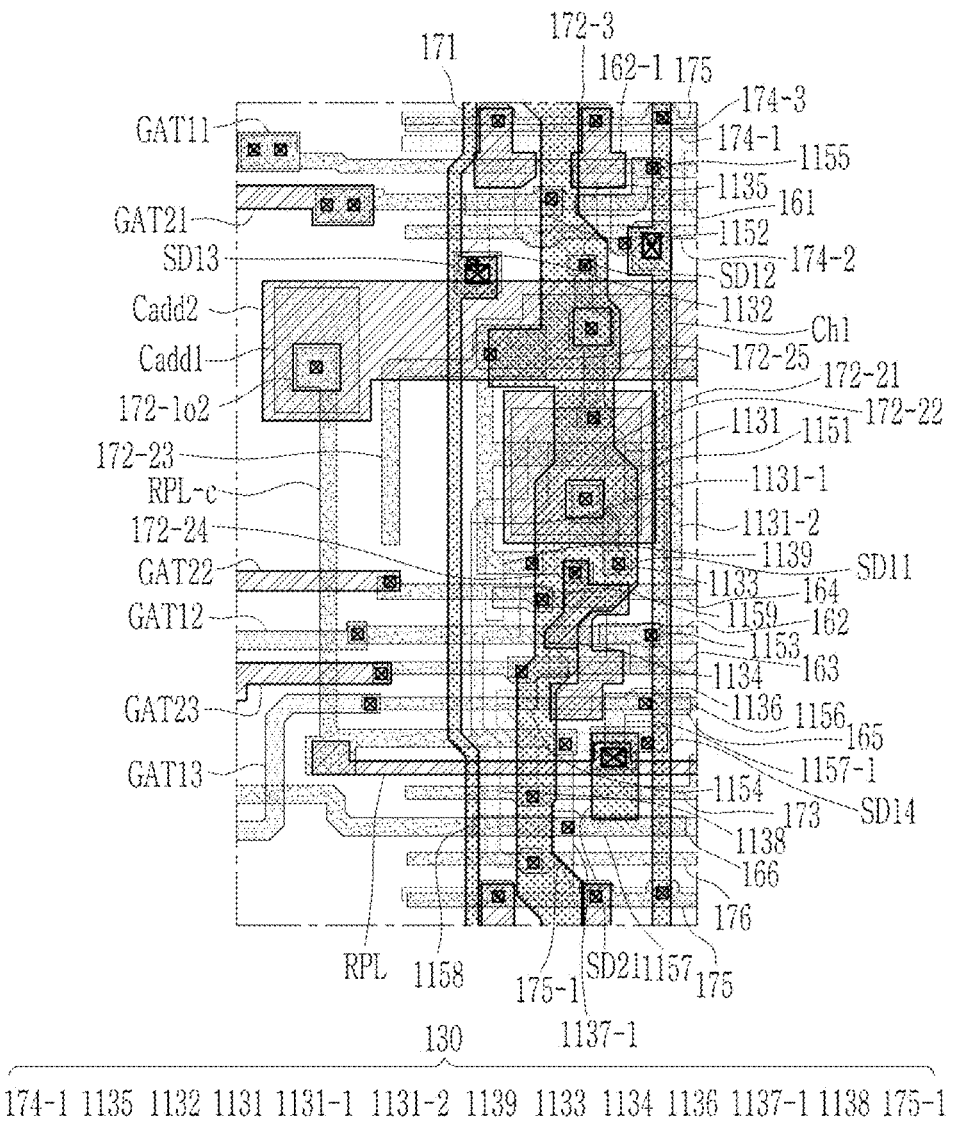

Referring to FIG. 20, the second data conductive layer may be disposed on the first organic layer 144.

The second data conductive layer illustrated in FIG. 20 may not be different from the second data conductive layer illustrated in FIG. 9.

Figure 21:
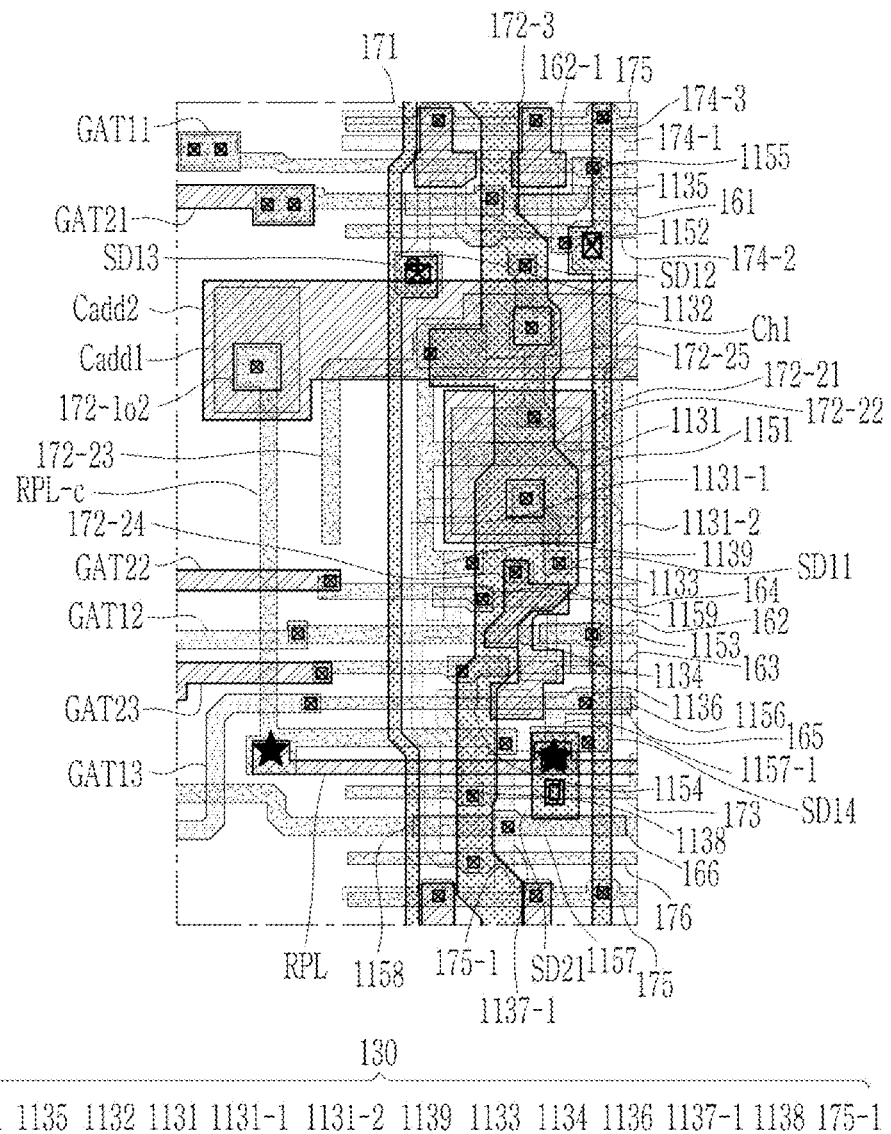

Referring to FIG. 11, the second organic layer 145 may be positioned on the second data conductive layer, and referring to FIG. 21, the opening OP3 may not be positioned in the second organic layer 145.

For example, in the display pixel, the opening OP3 may be positioned on the second organic layer 145 to expose the second data conductive layer, and an anode of the light emitting diode LED may be connected to a second electrode of the sixth transistor T6 of the display pixel.

However, since the repair pixel RPX does not include the light emitting diode LED, the opening OP3 may not be positioned in the second organic layer 145. In case that a defective display pixel occurs, an expanding portion of the repair line RPL may be short-circuited with the second electrode of the sixth transistor T6 (refer to Short in FIG. 21) by a laser.

In the repair pixel RPX, the anode of the light emitting diode LED may not be formed at an upper portion of the second organic layer 145, and an emission layer of the light emitting diode LED may also not be formed. The pixel defining layer and the cathode may be positioned at an upper portion of the second organic layer 145 in the repair pixel RPX. An encapsulation layer or an encapsulation substrate may be formed on the cathode even in the repair pixel RPX.

In the above, the structure of the repair pixel RPX has been reviewed through FIG. 14 to FIG. 21.

In the above, an embodiment in which the seventh transistor T7 of the display pixel receives the second initialization voltage Vaint and transfers it to the anode electrode has been described.

However, according to an embodiment, the seventh transistor T7 of the display pixel may receive the first initialization voltage Vint and transfer it to the anode electrode, and this embodiment will be described through FIG. 22 to FIG. 27 below.

FIG. 22 to FIG. 27 each illustrate a schematic diagram of an equivalent circuit of a display pixel included in an emissive display device according to an embodiment.

An embodiment of FIG. 22 will be described as follows.

Figure 22:
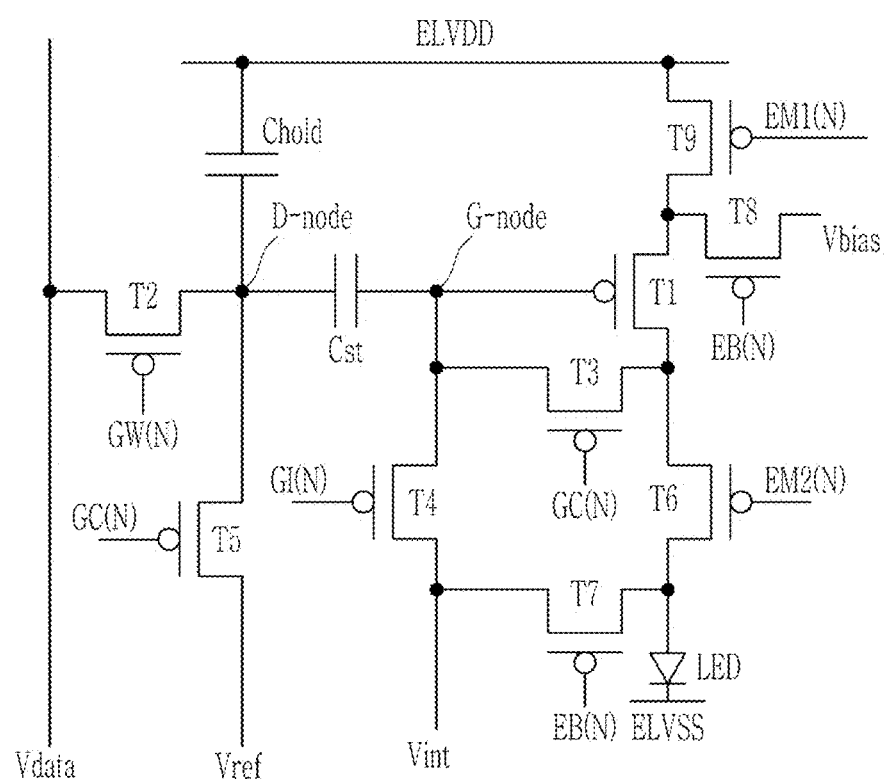
FIG. 22 to FIG. 27 each illustrate a schematic diagram of an equivalent circuit a of one display pixel included in an emissive display device according to an embodiment.

Unlike in FIG. 1, in FIG. 22, the first initialization voltage Vint is applied to the first electrode of the seventh transistor T7, and the anode of the light emitting diode LED is initialized to the first initialization voltage Vint.

Since the second initialization voltage Vaint is not applied to the display pixel of FIG. 22, the repair pixel of FIG. 13 may be used as it is in case that the display pixel of FIG. 22 is repaired. This is because the eleventh transistor T11 in FIG. 13 uses the first initialization voltage Vint and does not include the second initialization voltage Vaint.

Unlike in FIG. 3 to FIG. 10 and FIG. 14 to FIG. 21, in the display pixel and the repair pixel RPX in which the second initialization voltage Vaint is not used, the second-1 initialization voltage line 175-1 and the second initialization voltage line 175 may not be formed.

According to an embodiment, one of the display pixel and the repair pixel may receive the second initialization voltage Vaint.

In the above, the transistors included in FIG. 1, FIG. 13, and FIG. 22 all include transistors of a same type. For example, referring to FIG. 1, all transistors may be formed by using a polycrystalline semiconductor, may be doped with a same type of doped particles, and may be turned on in case that a low voltage is applied to the gate electrode and turned off in case that a high voltage is applied. Hereinafter, such a transistor is referred to as a p-type transistor.

However, according to an embodiment, the transistor may be formed using an oxide semiconductor, and may be turned on in case that a high voltage is applied to the gate electrode and turned off in case that a low voltage is applied. Hereinafter, such a transistor is referred to as an n-type transistor.

According to an embodiment, p-type transistors may be used for some transistors, and n-type transistors may be used for some transistors.

According to an embodiment, although all transistors may be changed to n-type transistors, hereinafter, some embodiments in which p-type transistors may be used for some transistors and n-type transistors may be used for some transistors will be described through FIG. 23 to FIG. 27.

First, an embodiment of FIG. 23 will be described.

Figure 23:
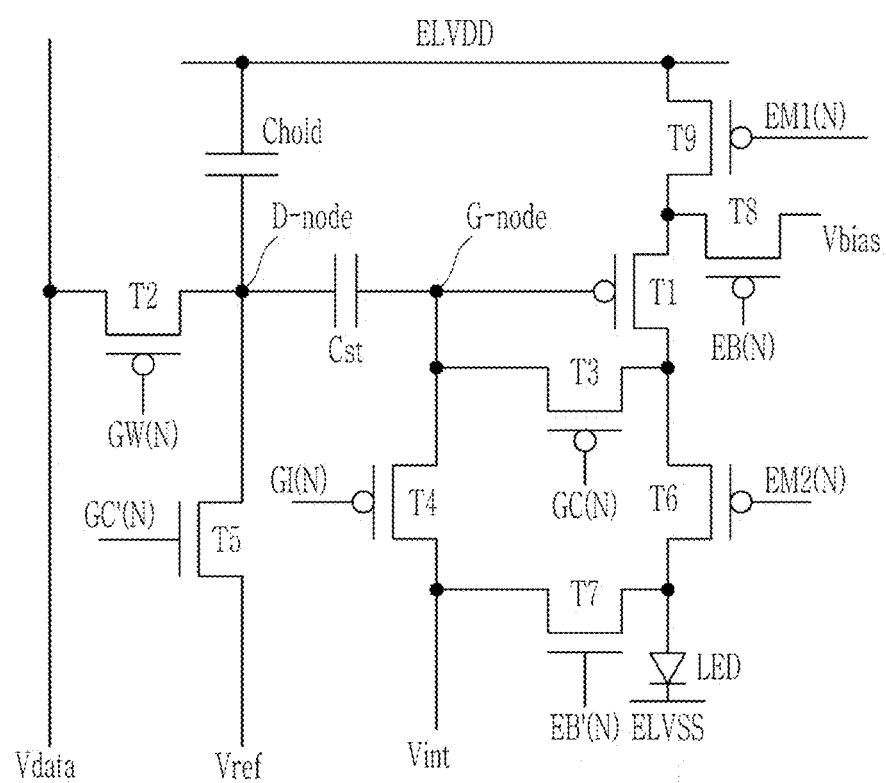

FIG. 23 illustrates a modification of FIG. 2, wherein the fifth transistor T5 and the seventh transistor T7 are formed as n-type transistors, and the remaining transistors (the driving transistor T1, the second transistor T2, the third transistor T3, the fourth transistor T4, the sixth transistor T6, the eighth transistor T8, and the ninth transistor T9) are formed as p-type transistors.

By way of example, the fifth transistor T5 includes a gate electrode connected to a second-1 scan line to which a second-1 scan signal GC'(N) is applied, a first electrode receiving a reference voltage Vref, and a second electrode connected to the D-node. The fifth transistor T5 serves to initialize the second electrode of the storage capacitor Cst and the first electrode of the hold capacitor Chold by changing each of them into the reference voltage Vref. Herein, a voltage level of the second-1 scan signal GC'(N) may be changed at the same timing as the second scan signal GC(N) applied to the third transistor T3, and signals having opposite polarities, for example, the second-1 scan signal GC'(N), may be a signal inverted vertically from the second scan signal GC(N) illustrated in FIG. 2. Accordingly, In case that the second scan signal GC(N) has a high-level voltage, the second-1 scan signal GC'(N) has a low-level voltage, and in case that the second scan signal GC(N) has a low-level voltage, the second-1 scan signal GC'(N) may have a high-level voltage.

The seventh transistor T7 includes a gate electrode connected to a fourth-1 scan line to which a fourth-1 scan signal EB'(N) is applied, a second electrode connected to the first electrode to which a first initialization voltage Vint is applied, and an anode electrode of the light emitting diode LED. A second electrode of the seventh transistor T7 is also connected to a second electrode of the sixth transistor T6. The seventh transistor T7 has the first initialization voltage Vint to initialize the anode of the light emitting diode LED. Herein, a voltage level of the fourth-1 scan signal EB'(N) may be changed at the same timing as the fourth scan signal EB(N) applied to the eighth transistor T8, and signals having opposite polarities, for example, the fourth-1 scan signal EB'(N), may be a signal inverted vertically from the fourth scan signal EB(N) illustrated in FIG. 2. Accordingly, in case that the fourth scan signal EB(N) has a high-level voltage, the fourth-1 scan signal EB'(N) has a low-level voltage, and in case that the fourth scan signal EB(N) has a low-level voltage, the fourth-1 scan signal EB'(N) may have a high-level voltage.

Except for the above differences, the embodiment of FIG. 23 may be the same as an embodiment of FIG. 22.

Hereinafter, an embodiment of FIG. 24 will be described.

Figure 24:
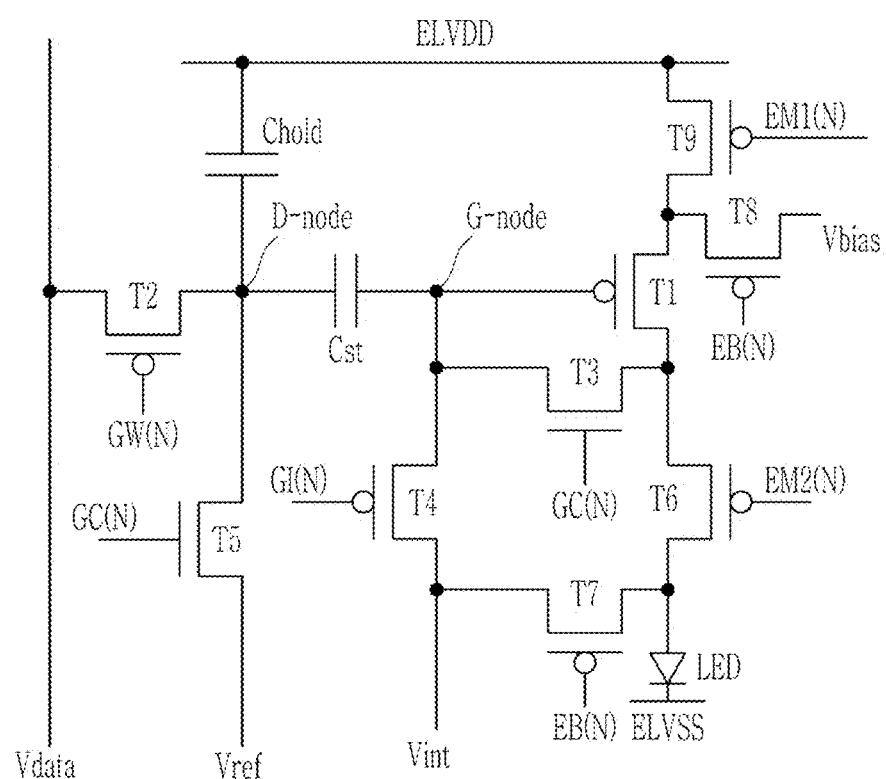

In FIG. 24, unlike in FIG. 22, the third transistor T3 and the fifth transistor T5 are formed as n-type transistors, and the remaining transistors (the driving transistor T1, the second transistor T2, the fourth transistor T4, the sixth transistor T6, the seventh transistor T7, the eighth transistor T8, and the ninth transistor T9) are formed as p-type transistors.

By way of example, a connection relationship and role of the third transistor T3 and the fifth transistor T5 is not different from those of FIG. 22.

For example, the second transistor T3 may include a gate electrode connected to a second scan line to which a second scan signal GC(N) is applied, a first electrode (input-side electrode) connected to the second electrode of the driving transistor T1, and a second electrode (output-side electrode) connected to the G-node. Accordingly, the second electrode of the third transistor T3 is connected to the first electrode of the storage capacitor Cst, the driving gate electrode of the driving transistor T1, and the second electrode of the fourth transistor T4. The third transistor T3 may enable a threshold voltage of the driving transistor T1 to be transferred to the first electrode of the storage capacitor Cst and to be compensated by forming a compensation path for compensating the threshold voltage of the driving transistor T1. As a result, even in case that the threshold voltage of the driving transistor T1 included in each pixel is different, the driving transistor T1 may output a constant output current depending on the applied data voltage Vdata.

The fifth transistor T5 includes a gate electrode connected to a second scan line to which a second scan signal GC(N) is applied, a first electrode receiving a reference voltage Vref, and a second electrode connected to the D-node. The fifth transistor serves to initialize the second electrode of the storage capacitor Cst and the first electrode of the hold capacitor Chold by changing each of them into the reference voltage Vref.

However, the two transistors (third transistor T3 and fifth transistor T5) receiving the second scan signal GC(N) are n-type transistors, and thus, it may be a signal vertically inverted from the second scan signal GC(N) of FIG. 2. For example, the second scan signal GC(N) may be a signal to which a high-level voltage is applied to turn on the third and fifth transistors T3 and T5.

Except for the above differences, FIG. 24 may be the same as an embodiment of FIG. 22.

Hereinafter, an embodiment of FIG. 25 will be described.

Figure 25:
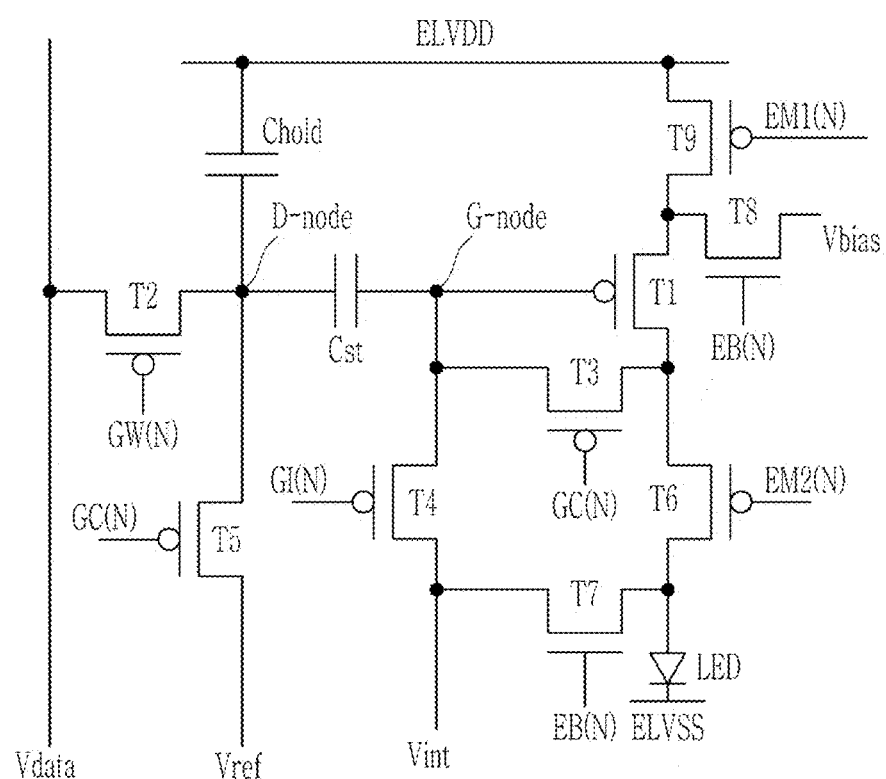

In FIG. 25, unlike in FIG. 22, the seventh transistor T7 and the eighth transistor T8 are formed as n-type transistors, and the remaining transistors (the driving transistor T1, the second transistor T2, the third transistor T3, the fourth transistor T4, the fifth transistor T5, the sixth transistor T6, and the ninth transistor T9) are formed as p-type transistors.

By way of example, a connection relationship and role of the seventh transistor T7 and the eighth transistor T8 is not different from that of FIG. 22.

For example, the seventh transistor T7 includes a gate electrode connected to a fourth scan line to which a fourth scan signal EB(N) is applied, a second electrode connected to the first electrode to which a second initialization voltage Vaint is applied, and an anode electrode of the light emitting diode LED. A second electrode of the seventh transistor T7 is also connected to a second electrode of the sixth transistor T6. The seventh transistor T7 has a second initialization voltage Vaint to initialize the anode of the light emitting diode LED.

The eighth transistor T8 includes a gate electrode connected to a fourth scan line to which a fourth scan signal EB(N) is applied, a first electrode to which a bias voltage Vbias is applied, and a second electrode connected to the first electrode of the driving transistor T1. A second electrode of the eighth transistor T8 is also connected to a second electrode of the ninth transistor T9. The eighth transistor T8 may maintain a bias of the first electrode of the driving transistor T1 to be constant as a bias voltage Vbias, and even in case that driving high or low frequencies, may allow the driving transistor T1 to output a constant output current without changing the bias of the driving transistor T1. As a result, the driving transistor T1 may constantly generate an output current even during a period in which the data voltage Vdata is not transferred into the display pixel.

However, the two transistors (seventh transistor T7 and eighth transistor T8) receiving the second scan signal EB(N) are n-type transistors, and thus, it may be a signal vertically inverted from the fourth scan signal EB(N) of FIG. 2. For example, the fourth scan signal EB(N) may be a signal to which a high-level voltage is applied to turn on the seventh and eighth transistors T7 and T8.

Except for the above differences, FIG. 25 may be the same as an embodiment of FIG. 22.

Hereinafter, an embodiment of FIG. 26 will be described.

Figure 26:
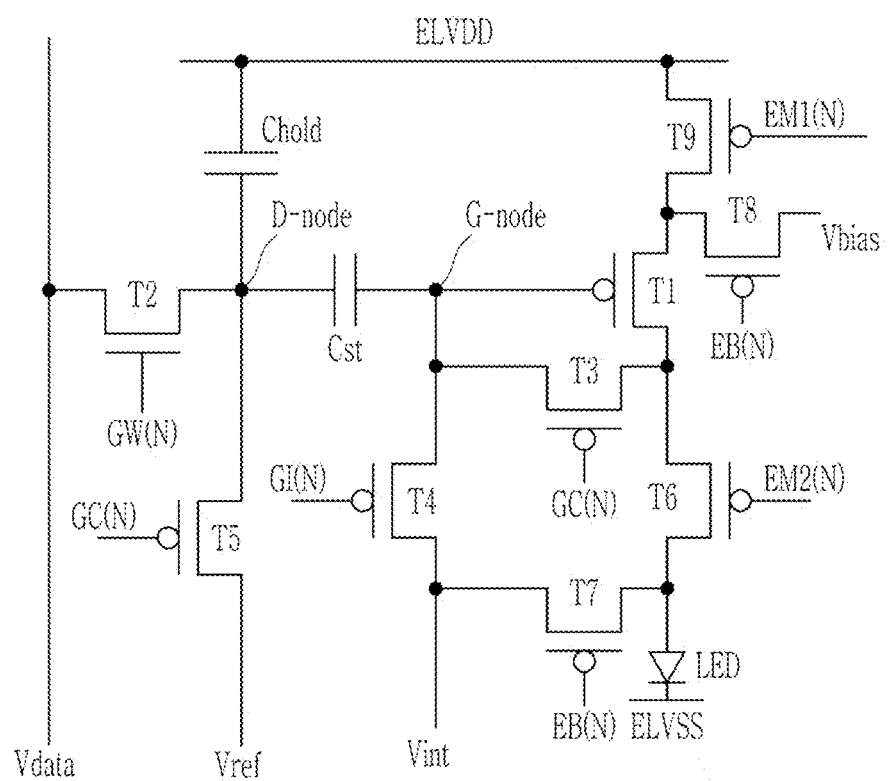

In FIG. 26, unlike in FIG. 22, the second transistor T2 is formed as an n-type transistor, and the remaining transistors (the driving transistor T1, the third transistor T3, the fourth transistor T4, the fifth transistor T5, the sixth transistor T6, the seventh transistor T7, the eighth transistor T8, and the ninth transistor T9 are formed as p-type transistors.

By way of example, a connection relationship and role of the second transistor T2 is not different from those of FIG. 22.

For example, the second transistor T2 includes a gate electrode connected to a first scan line to which the first scan signal GW(N) is applied, a first electrode (input-side electrode) connected to the data line to which the data voltage Vdata is applied, and a second electrode (output-side electrode) connected to the second electrode of the storage capacitor Cst. The second transistor T2 allows the data voltage Vdata to enter the display pixel and to be stored in the storage capacitor Cst according to the first scan signal GW(N). A second electrode of the second transistor T2 is connected to a second electrode (output-side electrode) of the fifth transistor T5 and a first electrode of the hold capacitor Chold.

However, the second transistor T2 receiving the first scan signal GW(N) is an n-type transistor, and thus, it may be a signal vertically inverted from the first scan signal GW(N) of FIG. 2. For example, the first scan signal GW(N) may be a signal to which a high-level voltage is applied to turn on the second transistor T2.

Except for the above differences, FIG. 26 may be the same as an embodiment of FIG. 22.

Hereinafter, an embodiment of FIG. 27 will be described.

Figure 27:
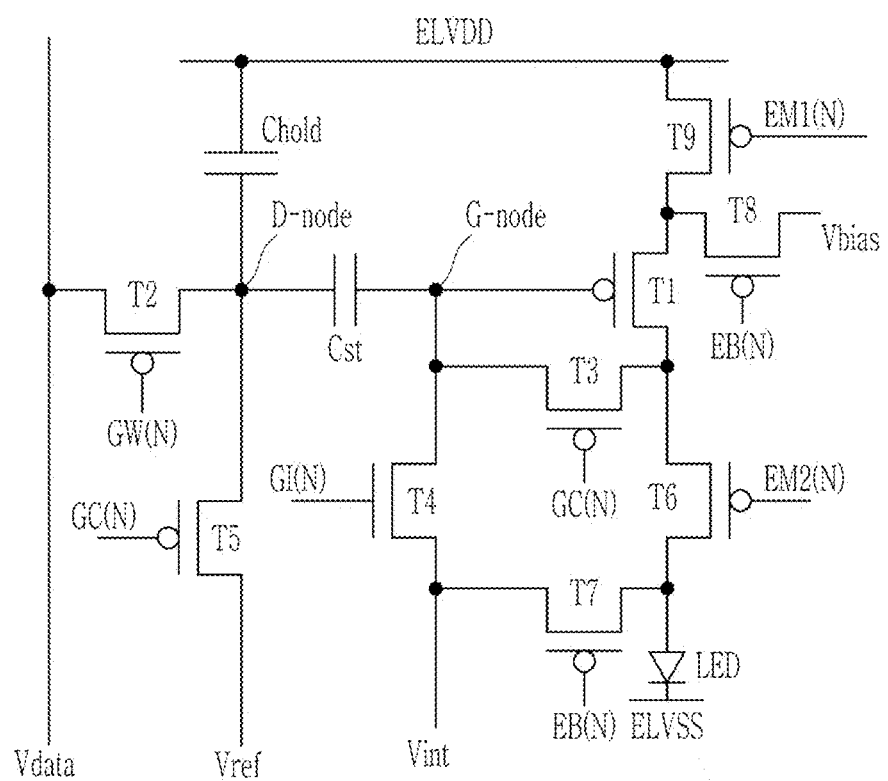

In FIG. 27, unlike in FIG. 22, the fourth transistor T4 is formed as an n-type transistor, and the remaining transistors (the driving transistor T1, the second transistor T2, the third transistor T3, the fifth transistor T5, the sixth transistor T6, the seventh transistor T7, the eighth transistor T8, and the ninth transistor T9 are formed as p-type transistors.

By way of example, a connection relationship and role of the fourth transistor T4 is not different from those of FIG. 22.

For example, the fourth transistor T4 includes a gate electrode connected to a third scan line to which a third scan signal GI(N) is applied, a first electrode receiving a first initialization voltage Vint, and a second electrode connected to the G-node. The fourth transistor T4 serves to initialize the first electrode of the storage capacitor Cst and the gate electrode of the driving transistor T1 to the first initialization voltage Vint.

However, the fourth transistor T4 receiving the third scan signal GI(N) is an n-type transistor, and thus, it may be a signal vertically inverted from the third scan signal GI(N) of FIG. 2. For example, the third scan signal GI(N) may be a signal to which a high-level voltage is applied to turn on the third transistor T3.

Except for the above differences, FIG. 26 may be the same as an embodiment of FIG. 22.

Although the above has been described with only FIG. 23 to FIG. 27 as a modification of FIG. 22, other transistors including the driving transistor T1 may be changed to n-type transistors. Although embodiments of FIG. 23 to FIG. 27 above are modified based on FIG. 22, modifications may also be performed based on FIG. 1 or FIG. 13 according to an embodiment.

While this disclosure has been described in connection with what is considered to be practical embodiments, it is to be understood that the disclosure is not limited to the disclosed embodiments, but, on the contrary, is intended to cover various modifications and equivalent arrangements included within the spirit and scope of the appended claims.

What is claimed is:

1. An emissive display device comprising:
 a driving transistor that includes a driving gate electrode, a first electrode, and a second electrode;
 a storage capacitor that includes a first electrode electrically connected to the driving gate electrode and a second electrode;
 a hold capacitor that includes a first electrode electrically connected to the second electrode of the storage capacitor and a second electrode to which a driving voltage is applied;
 a light emitting diode that includes an anode; and
 a connector that directly electrically connects the first electrode of the hold capacitor and the second electrode of the storage capacitor, wherein
 the first electrode of the hold capacitor is disposed in a first gate conductive layer,
 the second electrode of the storage capacitor is disposed in a second gate conductive layer different from the first gate conductive layer, and
 the connector is disposed in a first data conductive layer disposed on the first gate conductive layer and the second gate conductive layer.

2. The emissive display device of claim 1, further comprising:
 a semiconductor layer disposed on a substrate;
 the first gate conductive layer disposed on the semiconductor layer;
 the second gate conductive layer disposed on the first gate conductive layer;
 the first data conductive layer disposed on the second gate conductive layer; and
 a second data conductive layer disposed on the first data conductive layer, wherein
 the driving gate electrode is disposed in the first gate conductive layer, and
 the second electrode of the hold capacitor is disposed in the second gate conductive layer.

3. The emissive display device of claim 2, further comprising:
 a second transistor that includes a first electrode receiving a data voltage and a second electrode electrically connected to the second electrode of the storage capacitor; and
 a third transistor configured to electrically connect the driving gate electrode of the driving transistor to the second electrode of the driving transistor.

4. The emissive display device of claim 3, further comprising:
 a fourth transistor configured to initialize a G node to a first initialization voltage; and
 a fifth transistor configured to change a D node to a reference voltage, wherein
 a node to which the first electrode of the storage capacitor is electrically connected is the G node, and
 a node to which the second electrode of the storage capacitor is electrically connected is the D node.

5. The emissive display device of claim 4, further comprising:
 a sixth transistor configured to electrically connect the anode of the light emitting diode and the second electrode of the driving transistor; and
 a seventh transistor configured to initialize the anode to a second initialization voltage.

6. The emissive display device of claim 5, further comprising:
 an eighth transistor configured to transfer a bias voltage to the first electrode of the driving transistor; and
 a ninth transistor configured to transfer the driving voltage to the first electrode of the driving transistor.

7. The emissive display device of claim 6, wherein the second initialization voltage and the first initialization voltage have a same voltage value or different voltage values.

8. An emissive display device comprising:
a display pixel disposed in a display area to include a pixel circuit part and a light emitting diode;
a repair pixel disposed outside the display area and not including a light emitting diode; and
a repair line that extends in a first direction from the display pixel to the repair pixel, wherein
the pixel circuit part of the display pixels includes:
a first pixel circuit part that includes:
a driving transistor to allow the driving transistor to generate an output current; and
a sixth transistor that includes:
a first electrode electrically connected to a second electrode of the driving transistor; and
a second electrode electrically connected to an anode of the light emitting diode of the display pixel:
a second pixel circuit part that includes a seventh transistor for initializing the anode of the light emitting diode,
the repair pixel includes:
a first repair pixel part having a same configuration as the first pixel circuit part; and
a second repair pixel part that includes a tenth transistor and an additional capacitor,
the tenth transistor includes a first electrode electrically connected to the repair line and a second electrode electrically connected to a first electrode of the additional capacitor,
a driving voltage is applied to a second electrode of the additional capacitor,
the repair line includes an expanding portion overlapping the second electrode of the sixth transistor of the repair pixel in a second direction perpendicular to the first direction, a width of the expanding portion in a third direction different from both the first direction and the second direction being greater than a width in the third direction of another portion of the repair line between the expanding portion and the display pixel.

9. The emissive display device of claim 8, wherein
the second repair pixel part further includes an eleventh transistor,
a first electrode of the eleventh transistor receives an initialization voltage, and
a second electrode of the eleventh transistor is electrically connected to the second electrode of the tenth transistor and the first electrode of the additional capacitor.

10. The emissive display device of claim 9, wherein an area occupied by the repair pixel is larger than an area of the display pixel.

11. The emissive display device of claim 10, wherein the repair pixel has an area that is larger than the display pixel by an area occupied by the additional capacitor.

12. The emissive display device of claim 10, wherein the first pixel circuit part and the first repair pixel part each include:
a storage capacitor that includes a first electrode electrically connected to a driving gate electrode of the driving transistor and a second electrode;
a second transistor electrically connected to the second electrode of the storage capacitor;
a hold capacitor that includes a first electrode electrically connected to the second electrode of the storage capacitor and a second electrode to which the driving voltage is applied; and
a third transistor configured to connect the driving gate electrode of the driving transistor and the second electrode of the driving transistor.

13. The emissive display device of claim 12, wherein
the first pixel circuit part and the first repair pixel part each further include:
a fourth transistor configured to initialize a G node; and
a fifth transistor configured to transfer a reference voltage to a D node, and
a second electrode of the sixth transistor is electrically connected to the first electrode of the tenth transistor and the repair line in the repair pixel,
a node to which the first electrode of the storage capacitor is electrically connected is the G node, and
a node to which the second electrode of the storage capacitor is electrically connected is the D node.

14. The emissive display device of claim 13, wherein the first pixel circuit part and the first repair pixel part each further include:
an eighth transistor configured to transfer a bias voltage to a first electrode of the driving transistor; and
a ninth transistor configured to transfer the driving voltage to the first electrode of the driving transistor.

15. The emissive display device of claim 13, wherein an initialization voltage transferred to the first electrode of the eleventh transistor has a voltage that is about equal to or different from a voltage for initializing the G node through the fourth transistor.

16. The emissive display device of claim 15, wherein a voltage for initializing the anode by the seventh transistor is substantially equal to the voltage for initializing the G node through the fourth transistor or the initialization voltage transferred to the first electrode of the eleventh transistor.

17. The emissive display device of claim 13, wherein at least one of transistors included in the first pixel circuit part and at least corresponding one of transistors included in the first repair pixel part have a same transistor size.

18. The emissive display device of claim 17, wherein
storage capacities of the storage capacitors respectively included in the first pixel circuit part and the first repair pixel part are different from each other, and
storage capacities of the hold capacitors respectively included in the first pixel circuit part and the first repair pixel part are different from each other.

19. The emissive display device of claim 8, wherein
the expanding portion of the repair line overlapping the second electrode of the sixth transistor of the repair pixel is short-circuited in case that a defective display pixel is repaired.

20. The emissive display device of claim 19, wherein
an another expanding portion is included at an end of the repair line, and
the another expanding portion disposed at the end of the repair line is short-circuited to form an electrical connection with an electrode of the additional capacitor in case that the defective display pixel is repaired.

* * * * *